United States Patent [19]
Ueda et al.

[11] Patent Number: 5,986,313
[45] Date of Patent: Nov. 16, 1999

[54] SEMICONDUCTOR DEVICE COMPRISING MISFETS AND METHOD OF MANUFACTURING THE SAME

[75] Inventors: Tetsuya Ueda; Takashi Uehara; Kousaku Yano; Satoshi Ueda, all of Osaka, Japan

[73] Assignee: Matsushita Electric Industrial Co., Ltd., Osaka, Japan

[21] Appl. No.: 08/988,776

[22] Filed: Dec. 11, 1997

Related U.S. Application Data

[60] Division of application No. 08/571,131, Dec. 12, 1995, Pat. No. 5,733,812, which is a continuation-in-part of application No. 08/340,341, Nov. 14, 1994, abandoned.

[30] Foreign Application Priority Data

Nov. 15, 1993 [JP] Japan ........................ 5-284820
Oct. 26, 1995 [JP] Japan ........................ 7-278546

[51] Int. Cl.⁶ .................... H01L 29/76; H01L 29/94; H01L 31/062; H01L 31/113
[52] U.S. Cl. ............................................... 257/401
[58] Field of Search .......................... 438/289, 300, 438/301; 257/402, 403, 401

[56] References Cited

U.S. PATENT DOCUMENTS 5,270,249  12/1993  Fukuma ........................ 437/162
5,422,297  6/1995  Yamauchi ........................ 437/52

*Primary Examiner*—Brian Dutton
*Attorney, Agent, or Firm*—McDermott, Will & Emery

[57] ABSTRACT

There is formed an isolation which surrounds an active region of a semiconductor substrate. Formed over the active region and on the isolation, respectively, are a gate electrode and two gate interconnections on both sides thereof. Between the gate electrode and the gate interconnections are located two first interspaces each of which is smaller in width than a specified value and a second interspace which is larger in width than the specified value and interposed between the two first interspaces. In forming side walls on both side faces of the gate electrode and gate interconnections by depositing an insulating film on the substrate, the first interspaces are buried with the insulating film. Thereafter, a metal film is deposited on the substrate, followed by chemical mechanical polishing till the gate electrode, gate interconnections, and side walls become exposed. By the process, withdrawn electrodes from a source/drain region for contact with the active region is formed by self alignment, while the withdrawn electrodes are insulated from the gate electrode and gate interconnections by the side walls.

4 Claims, 27 Drawing Sheets

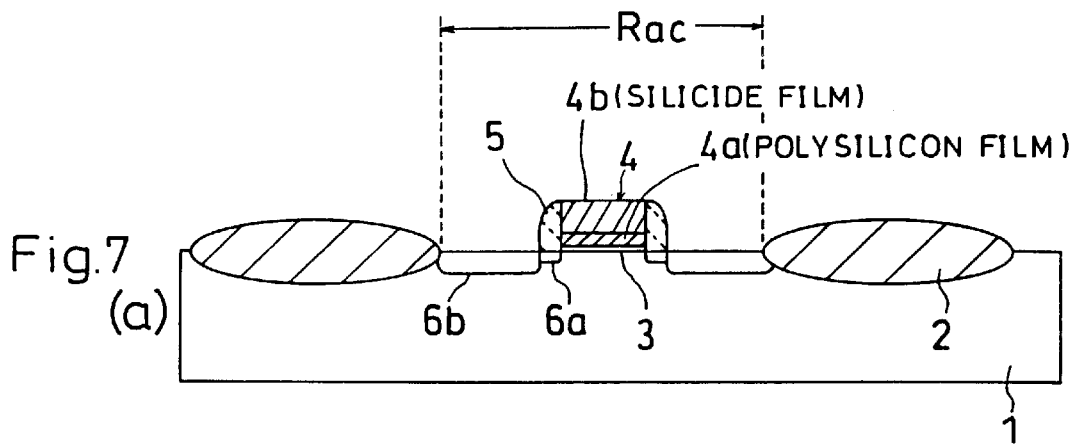
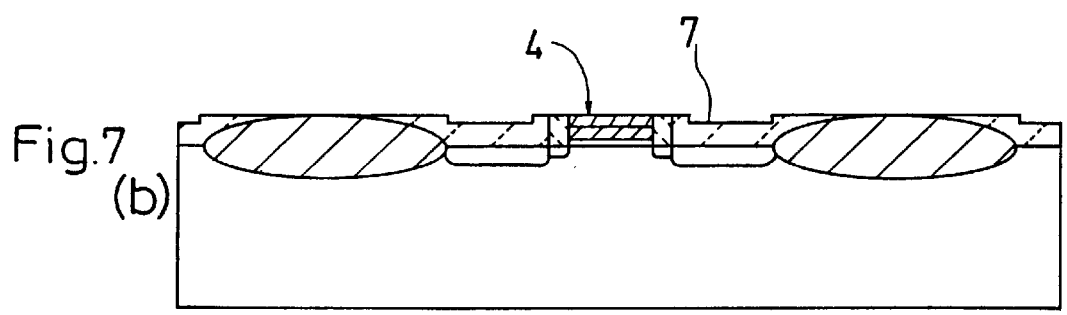
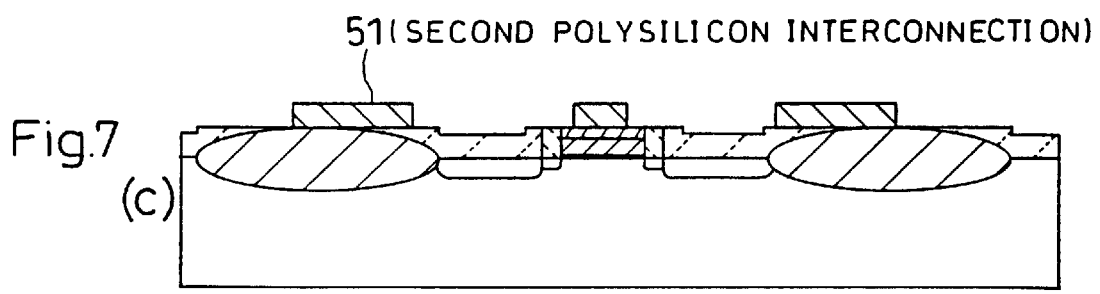

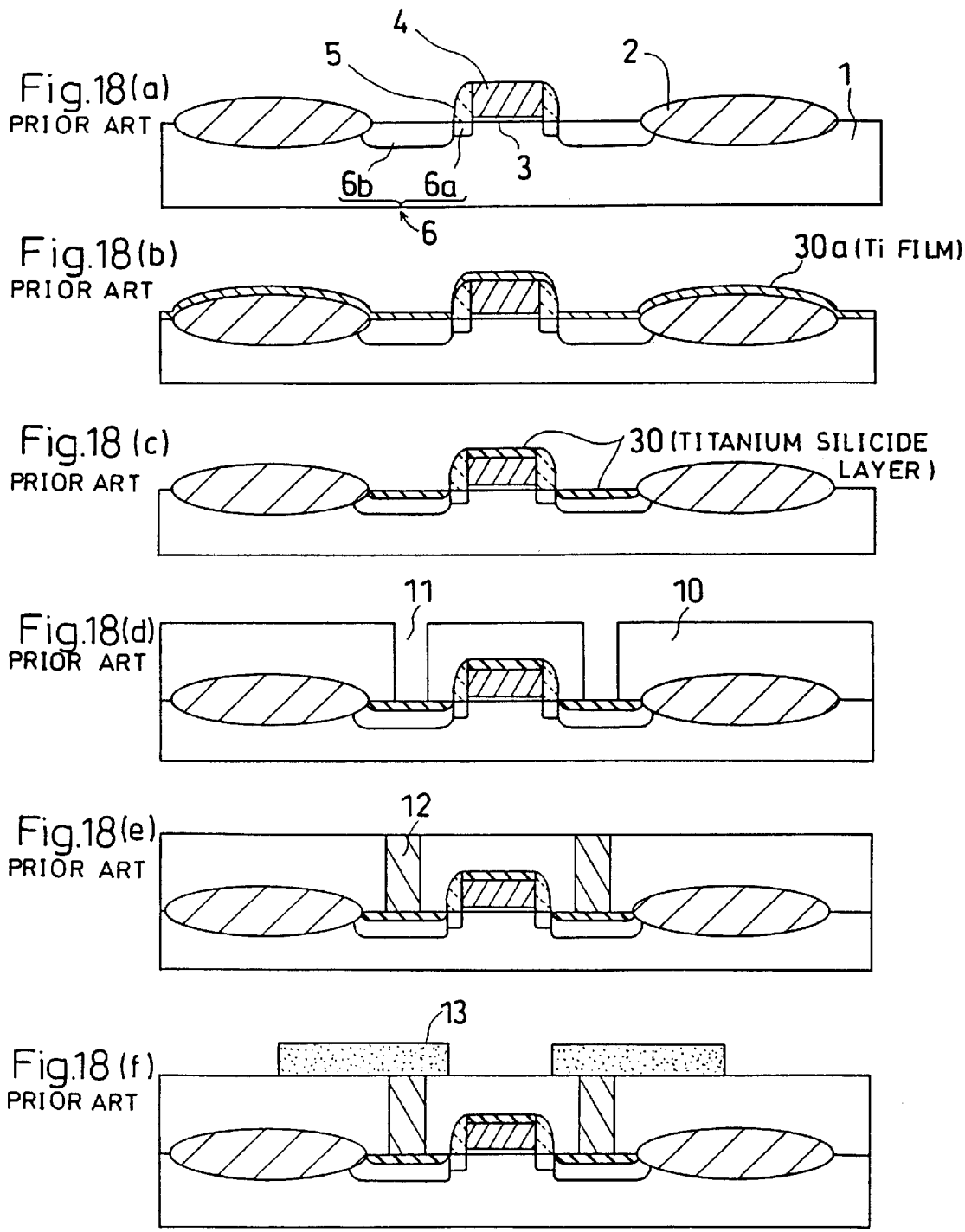

SEMICONDUCTOR DEVICE COMPRISING MISFETS AND METHOD OF MANUFACTURING THE SAME

This is a divisional of application Ser. No. 08/571,131, filed Dec. 12, 1995, now U.S. Pat. No. 5,733,812 which is a continuation-in-part of Ser. No. 08/340,341, filed Nov. 14, 1994 now abandoned.

BACKGROUND OF THE INVENTION

The present invention relates to a semiconductor apparatus in which a field-effect transistor (FET) is disposed and to a method of manufacturing the same. More particularly, it relates to a method of lowering the resistance of an impurity diffusion layer in the FET.

With the increasing miniaturization of a large-scale semiconductor integrated circuit in recent years, a MISFET has been reduced in size by lowering the resistances of its impurity diffusion layer and gate interconnection. To lower the resistance of an impurity diffusion layer, there has been developed "salicide" technology for actual use, which is a method wherein a metal with high melting point such as Ti is deposited on the impurity diffusion layer in a silicon substrate and then the vicinity of the Si—Ti interface is silicidized through the mutual diffusion of Si and Ti between the silicon substrate and the resulting Ti film, thereby lowering the resistance value of the impurity diffusion layer. On the other hand, there has been introduced a method wherein tungsten is buried in a contact hole by selective CVD or blanket tungsten is used to fill up the contact hole, since the aspect ratio of the contact hole has been increased in order to minimize the contact area between the interconnection and silicon.

There has also been proposed a method, which is a combination of the above two technologies, in "A NOVEL DOUBLE-SELF-ALIGNED $TiSi_2$/TiN CONTACT WITH SELECTIVE CVD W PLUG FOR SUBMICRON DEVICE AND INTERCONNECT APPLICATIONS (IEEE. VLSI Symp 5—5 p.41, 1991)" by Martin S. Wang et al.

Below, the composite salicide method disclosed in the above document will be described with reference to FIGS. 18(a) to 18(f), which illustrate the transition of the cross sectional structure of a silicon substrate during the process of manufacturing a semiconductor apparatus.

FIG. 18(a) shows a MOS transistor of LDD structure that has been formed previously. In the drawing, 1 designates a silicon substrate, 2 designates an isolation formed by a LOCOS method, 3 designates: a gate oxide film, 4 designates a polysilicon electrode, 5 designates a side wall, and 6 designates an impurity diffusion layer (the impurity diffusion layer includes a low-concentration source/drain 6a and a high-concentration source/drain 6b). The manufacturing method is identical with a conventional method of manufacturing a CMOS device, up to the stage shown in FIG. 18(a). Moreover, the doping with As, P, and B and the subsequent thermal treatment have been conducted in accordance with the characteristics of a p-channel MOS transistor. Next, as shown in FIG. 18(b), a Ti thin film 30 for a salicide is deposited by sputtering, followed by annealing for silicidization as shown in FIG. 18(c). After that, the titanium on the oxide film is removed by wet etching so as to implant $N_2$. Subsequently, $TiSi_x$ (silicidized titanium layer) 30 is formed only on the impurity diffusion layers 6 and gate polysilicon 4. After a BPSG film 10 weas deposited, a contact hole 11 is formed in a desired position of the BPSG film 10 by photolithography and by dry etching (using a gas containing $CHF_2+O_2$ as its main component), as shown in FIG. 18(d). Next, as shown in FIG. 18(e), a W (tungsten) plug 12 is deposited by selective CVD. Then, after depositing a film consisting of TiN/AlSiCu/Ti by sputtering, as shown in FIG. 18(f), the resulting film is patterned to form a metal interconnection 13. The above process provides a semiconductor apparatus having the MOS transistor with the salicide structure and the W plug formed by selective CVD.

However, the conventional semiconductor apparatus with the structure described above has the following disadvantages:

(1) Although the formation of a silicide film 7b requires the reaction between the metal with high melting point and the underlying silicon, if the impurity diffusion layer 6 is shallow, it becomes difficult to form a junction between the metal with high melting point and silicon. However, since a future device requires the formation of an impurity diffusion layer as shallow as possible. it becomes difficult to form an effective junction, so that the salicide technology is not necessarily compatible with a future device.

(2) Since the silicide layer shows poor immunity to a gas containing CF as its main component in etching for forming a contact hole, defects such as a pin hole are easily caused, which may incur an increase in the resistance of the impurity diffusion layer.

(3) In a transistor with a shallow junction formed between the metal with high melting point and silicon, over-etching for surely forming each contact hole cannot be performed satisfactorily in etching for forming a contact hole in the shallow junction therebetween. Consequently, the reliability of an interconnection may be impaired.

(4) A thermal treatment at 650° C. or a higher temperature is required in order to lower the resistance of the silicide layer. Consequently, the electrical characteristics of the transistor may be impaired.

(5) The silicide layer hardly serves as a satisfactory barrier metal layer in forming the W plug by selective CVD, so that its manufacturing conditions for preventing junction leakage become more stringent.

(6) With the structure shown in FIG. 18(f), the degree of planarization of the base underlying the BPSG film 10 is not satisfactory.

SUMMARY OF THE INVENTION

To attain the above object, a basic method of manufacturing a semiconductor apparatus according to the present invention comprises: a first step of forming an isolation which surrounds an active region of a semiconductor substrate in which a MISFET is to be formed; a second step of introducing an impurity for controlling a threshold of the above MISFET into the above active region; a third step of forming at least three first conductive interconnections serving as a gate electrode of the above MISFET over the above active region and serving as gate interconnections of the above MISFET on the isolation on both sides of the above active region such that an interspace between the above gate electrode and each of the above gate interconnections is composed of at least two first interspaces, each of which is smaller in width than a specified value T, and of a second interspace between the above first interspaces, which is larger in width than the above specified value T; a fourth step of depositing an insulating film over the above first conductive interconnections and the above interspaces: a fifth step of performing anisotropic etching with respect to the above insulating film so as to form side walls composed of remaining portions of the above insulating film on both side faces of the above first conductive interconnections with the above insulating film buried in the above first interspaces, while partially exposing the active region on both sides of the above first conductive interconnections in the above second interspace; a sixth step of forming two impurity diffusion layers serving as a source/drain region of the above MISFET in those regions of the active region which are located on both sides of the above gate electrode: a seventh step of depositing, after the above sixth step, a metal film over the entire surface of the substrate; and an eighth step of performing, after the above seventh step, chemical mechanical polishing for partially removing the above metal film, the above first conductive interconnections, and the above side walls such that, in a plane when the chemical mechanical polishing is completed, the above gate electrode, the above gate interconnections, and the above metal film are partially left and two remaining portions of the above metal film on the above respective impurity diffusion layers, which are surrounded by the above side walls and the above insulating film buried in the first interspaces, form second conductive interconnections electrically isolated from each other.

By the method, the second conductive interconnections for contact with the active region function as withdrawn electrodes from the source/drain region of the MISFET. Moreover, the individual withdrawn electrodes are electrically isolated from each other by the insulating film buried in the first interspaces, while the individual withdrawn electrodes and the first conductive interconnections (gate electrode and gate interconnections) are isolated from each other by the side walls. Consequently, the withdrawn electrodes for contact with the active region, which occupy a large area, can be formed by self alignment, so that interconnections in the semiconductor apparatus can be miniaturized without incurring a defective connection between the electrodes and the active region.

In the above basic method of manufacturing a semiconductor apparatus, a LOCOS film can be formed in the above first step of forming an isolation. Alternatively, the isolation with trench structure can be formed by forming a trench portion surrounding the above active region in the above semiconductor substrate and then burying the above trench portion.

In the above basic method of manufacturing a semiconductor apparatus, the first conductive interconnections can be formed from a polysilicon film in the above third step.

By the method, it becomes possible to utilize general-purpose polysilicon process, thereby facilitating the manufacturing of semiconductor apparatus and reducing manufacturing cost.

In the above basic method of manufacturing a semiconductor apparatus, the first conductive interconnections can be formed from a two-layer film consisting of a lower conductive layer and an upper insulating layer in the above third step.

By the method, in the step of forming the side walls, a damage caused by anisotropic etching to the first conductive interconnections can surely be prevented.

The above basic method of manufacturing a semiconductor apparatus further comprises the step of, prior to the above fifth step. forming side walls for LDD at least on the side faces of the first conductive interconnection serving as the gate electrode, wherein the side walls formed in the above second step can function only as side walls for isolation.

By the method, there is formed an active element having LDD structure and miniaturized interconnections.

In the above basic method of manufacturing a semiconductor apparatus, after the above fifth step, the above side walls can be partially processed by dry etching, thereby electrically connecting the above first conductive interconnections to the above second conductive interconnections.

By the method, it becomes possible to electrically isolate the first conductive interconnections from the second conductive interconnections by the side walls, while electrically connecting the first conductive interconnections to the second conductive interconnections in a desired area without forming an additional interconnection. Consequently, the manufacturing process is simplified and the circuit area is further reduced.

In the above basic method of manufacturing a semiconductor apparatus, in the above third step, the first conductive interconnections which consist of an upper layer composed of an insulating film with a high etching rate and a lower layer composed of a conductive film are formed, the above method further comprising the step of, after the above fifth step, selectively removing only the insulating film with a high etching rate composing the upper layer of the above first conductive interconnections, wherein in the above seventh step, the above metal film is composed of a metal material with a low resistance and in the above eighth step, the metal film over the above active region is isolated from the metal film over the first conductive interconnections by the above side walls and the above second conductive interconnections are composed only of the above metal film, while chemical mechanical polishing can be performed so as to compose the above first conductive interconnections of a multi-layer film of the above first conductive film and the above metal film.

By the method, the resistance of the active region, i.e., the resistance of the region of the diffusion layer of the active element can be reduced without performing high-temperature thermal treatment such as salicide process. Moreover, the underlying semiconductor substrate is not consumed, so that an active element with minimum junction leakage can be obtained.

To reduce the capacitance of a gate electrode, there are also provided the following second and third methods of manufacturing semiconductor apparatus. The second method of manufacturing a semiconductor apparatus comprises the steps of: forming a circumferential isolation region which surrounds an active region of a semiconductor substrate in which a MISFET is to be formed; introducing an impurity for controlling a threshold of the above MISFET into the above active region; forming a stepped insulating film consisting of a portion which is sufficiently thin to enable the function of the above MISFET and a portion which is sufficiently thick to disenable the function of the MISFET and a gate electrode; forming side walls from an insulating material on both sides of the above gate electrode; forming two impurity diffusion layers which serve as a source/drain region of the above MISFET in those regions of the above active region which are located on both sides of the above gate electrode; depositing a metal film over the entire surface of the substrate after forming the above gate electrode, the above side walls, and the above circumferential isolation region; partially removing the above metal film, the above circumferential isolation region, the above gate electrode, and the above side walls by chemical mechanical polishing such that, in a plane when the chemical mechanical polishing is completed, two remaining portions of the above metal film on the above respective impurity diffusion layers are surrounded by the above gate electrode and the above circumferential isolation region and electrically isolated from each other.

The third method of manufacturing a semiconductor apparatus comprises the steps of: forming a circumferential isolation region which surrounds an active region of a semiconductor substrate in which a MISFET is to be formed; introducing an impurity for controlling a threshold of the above MISFET into the above active region so as to form, in a region in which a gate electrode is to be formed, a region into which the impurity has been introduced at a concentratior corresponding to a low threshold which enables the function of the above MISFET and a region into which the impurity has been introduced to a concentration corresponding to a high threshold which disenables the function of the above MISFET; forming a gate insulating film and the gate electrode of the above MISFET in the above active region; forming side walls from an insulating material on both sides of the above gate electrode; forming two impurity diffusion layers. which serve as a source/drain region of the above MISFET, in those regions of the above active region which are located on both sides of the above gate electrode; depositing a metal film over the entire surface of the substrate after forming the above gate electrode, the above side walls, and the above circumferential isolation region; and partially removing the above metal film, the above circumferential isolation region, the above gate electrode, and the above side walls by chemical mechanical polishing such that, in a plane when the chemical mechanical polishing is completed, two remaining portions of the above metal film on the above respective impurity diffusion layers are surrounded by the above gate electrode and the above circumferential isolation region and electrically isolated from each other.

By the methods, the capacitance of the gate electrode after the formation of the semiconductor apparatus; is reduced, resulting in the semiconductor apparatus operable at a high speed.

To facilitate the measurement of the characteristics of the semiconductor apparatus in the manufacturing process thereof, there is further provided a fourth method of manufacturing a semiconductor apparatus according to the present invention, which comprises the steps of: forming a circumferential isolation region for dividing a surface region of a semiconductor substrate into a first primary active region in which a first MISFET for use as an active element of the semiconductor apparatus is to by formed, a second primary active region in which a second MISFET for use as an element under test is to be formed, a first active region for measurement continued from a portion of the above second primary active region in which the gate electrode is to be formed, a second active region for measurement continued from a portion of the above second primary active region in which a drain is to be formed, a third active region for measurement continued from a portion of the above second primary active region in which a source is to be formed, and a fourth active region for measurement isolated from each of the above active regions; simultaneously introducing an impurity for controlling thresholds of the first and second MISFETs into each of the above active regions; forming respective gate insulating films and gate electrodes of the above first and second MISFETs in the above first and second primary active regions; forming side walls from an insulating material on both sides of the above gate electrodes; forming two impurity diffusion layers, which serve as source/drain regions of the above first and second MISFETs, in those regions of the above first and second primary active regions which are located on both sides of the above gate electrodes and in the above second and third active regions for measurement; depositing a metal film over the entire surface of the substrate after forming the above gate electrodes, the above side walls, and the above circumferential isolation region; and partially removing the above metal film, the above circumferential isolation region, the above gate electrodes, and the above side walls by chemical mechanical polishing such that, in a plane when the chemical mechanical polishing is completed, two remaining portions; of the above metal film on the above respective active regions are surrounded by the above gate electrodes and the above circumferential isolation region and electrically isolated from each other, the metal film isolated on a region extending from the drain in the second primary active region to the above second active region for measurement being used as an electrode for the drain of the second MISFET, the metal film isolated on a region extending from the source in the above second primary region to the above third active region for measurement being used as an electrode for the source of the second MISFET, the metal film isolated on the above fourth active region being used as an electrode for the substrate; and directly measuring, when the above chemical mechanical polishing is completed, characteristics of the above second MISFET via the electrodes for the gate, source, and drain of the second MISFET and via the electrode for the substrate.

The method enables an easy evaluation of the unfinished semiconductor apparatus being manufactured, which facilitates the setting of conditions compatible with the required characteristics of the semiconductor apparatus as well as the detection of a failure at an early stage of the manufacturing process.

The semiconductor apparatus formed in accordance with the above individual manufacturing methods also provide the same effects.

BRIEF DESCRIPTION OF THE DRAWINGS

FIGS. 7(a) to 7(c) are cross sectional views showing the transition of the structure of the semiconductor apparatus according to a second embodiment during the manufacturing process thereof;

FIG. 18 is a cross sectional view showing the transition of the structure of a conventional semiconductor apparatus during the manufacturing process thereof.

DETAILED DESCRIPTION OF THE INVENTION

Figure 1:
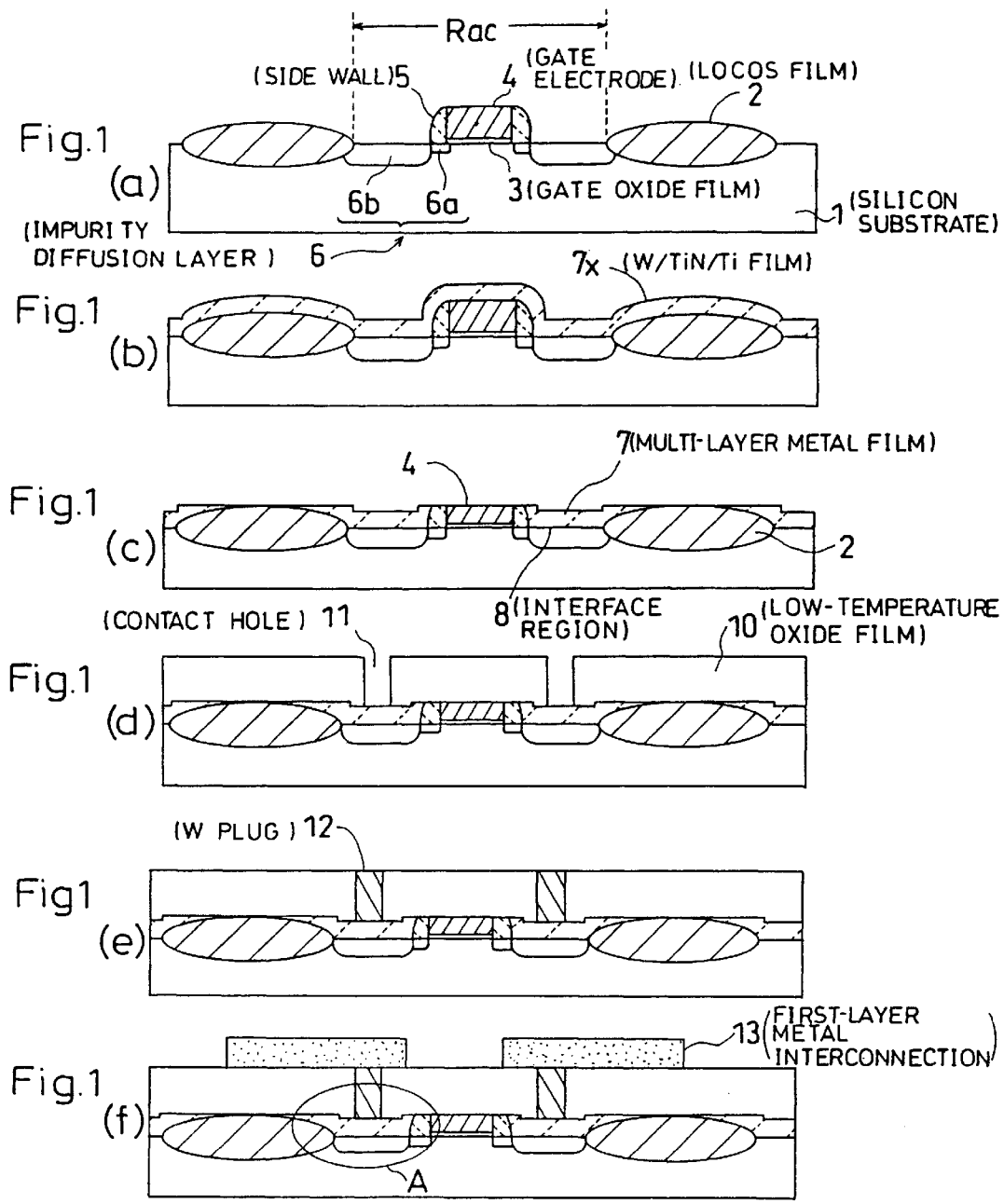
FIGS. 1(a) to 1(f) are cross sectional views showing the transition of the structure of a semiconductor apparatus according to a first embodiment during the manufacturing process thereof.

Below, the embodiments of the present invention will be described with reference to the drawings.

(First Embodiment)

A description will be given initially to a first embodiment with reference to FIGS. 1(a) to 1(f) and to FIGS. 2 to 6. FIGS. 1(a) to 1(f) are cross sectional views showing the transition of the structure of a semiconductor apparatus according to the first embodiment.

First, as shown in FIG. 1(a), a LOCOS film 2 (circumferential isolation region) with a thickness of 500 nm for partitioning a region of a p-type silicon substrate 1 into a plurality of active regions Rac is formed on the silicon substrate 1. After implanting impurity ions for controlling the threshold values of a p-channel MOSFET and of an n-channel MOSFET into each active region Rac and performing a thermal treatment, a silicon dioxide film with a thickness of 10 nm is formed by a dry oxidization. A polysilicon film with a thickness of 300 to 400 nm is further deposited by LPCVD, followed by the patterning of the silicon dioxide film and polysilicon film, thereby forming a gate electrode 4 and a gate oxide film 3. In place of the gate electrode 4 composed solely of polysilicon, it is also possible to form a polycide gate (silicide+polysilicon) or a polymetal gate (metal with high melting point+polysilicon).

Subsequently, n-type impurity ions at a low concentration are implanted into the active regions Rac on both sides of the above gate electrode 4 by using the gate electrode 4 as a mask. Thereafter, a HTO film is deposited over the entire surface of the substrate by LPCVD, followed by highly anisotropic dry etching, thereby forming side walls 5 on both sides of the gate electrode 4. After that, n-type impurity ions at a high concentration are implanted into the active regions Rac by using the gate electrode 4 and side walls 5 as a mask. At the end of the foregoing process, the impurity diffusion layers 6 each including an n⁻ region 6a (low-concentration source/drain region) and an n⁺ region 6b (high-concentration source/drain region) are formed in the active regions Rac on both sides of the gate electrode 4, as shown in FIG. 1(a). The above process complies with a conventional method of forming, a MOSFET. It will be appreciated that, in the case of forming a p-channel MOSFET, the regions 6a and 6b of the impurity diffusion layer 6 are doped with a p-type impurity.

Next, as shown in FIG. 1(b), sputtering is performed after a dip etching process using an etchant containing HF as its main component, so as to sequentially deposit a Ti film with a thickness of 10 nm and a TiN film with a thickness of 30 nm. After that, further sputtering is performed so as to deposit a W film with a thickness of 100 nm, thereby forraing a W/TiN/Ti film 7x. Of the W/TiN/Ti film 7x, the TiN/Ti Layers function as adhesion layers for the overlying W layer, while they have the function of lowering the resistance of the interface with the underlying silicon substrate 1. On the other hand, the W layer has the function of lowering the resistance of the impurity diffusion layer, the function of preventing an oxide film from being over-etched in the case of contact etching, and the function as a barrier metal. Since the sputtering of the TiN/Ti layer is performed with respect to a small geometry with a small aspect ratio, excellent step coverage is achieved.

Next, as shown in FIG. 1(c), the W/TiN/Ti film 7x over the LOCOS film 2 and gate electrode 4 is selectively removed using CMP (Chemical Nechanical Polishing) for metal. The removal is possible since the difference in level between the isolation 4 and the surface of the silicon substrate 1 is about 250 nm and the difference in level between the polysilicon film constituting the gate electrode 4 and the surface of the silicon substrate 1 is 300 nm. The CMP process enables the formation of multi-layer metal films 7 composed of the W/TiN/Ti film only on the surfaces of the n+ impurity diffusion 1 layers 6b on both sides of the gate electrode 4. That is, in a plane when the CMP process is completed, there are formed the multi-layer metal films 7 each of which is surrounded by the LOCOS film 2 and side wall 5 and hence is electrically isolated from its surroundings, as shown in FIG. 1(c).

Next, as shown in FIG. 1(d), a low-temperature oxide film 10 (USG (Undoped Silicon Glass) film formed by CVD under ordinary pressure) is deposited to a thickness of 500 nm on the substrate. Then, a contact hole 11 is formed in the resulting low-temperature oxide film 10. Since the underlying W/TiN/Ti film protects the interface region 8 between the multi-layer metal film 7 and the substrate 1, a sufficient margin is obtained for over-etching in forming the contact hole 11 by partially dry-etching the low-pressure oxide film 10.

Next, as shown in FIG. 1(e), tungsten is deposited in the contact hole 11 by selective CVD so as to form a W plug 12. Since tungsten is deposited selectively on the W layer, the reaction during the CVD process does not cause any damage to the underlying tungsten, which might have been caused to the underlying silicon in a conventional embodiment.

Finally, a TiN/AlSiCu/Ti film is deposited as; shown in FIG. 1(f), followed by the patterning of the resulting film, thereby forming a first-layer metal interconnection 13.

Below, a description will be given to the structural characteristics of the semiconductor apparatus thus fabricated through the above process. FIG. 2 shows in detail the multi-layer metal film 7 of W/TiN/Ti (the portion indicated by A in FIG. 1(f)) on the impurity diffusion layer 6. Although the Ti layer 21, TiN layer 22, W layer 23 are films deposited by sputtering, it is possible to deposit these films, while achieving excellent coverage, on the impurity diffusion layer 6 with a small aspect ratio. Moreover, since the top surfaces of the metal films, the gate electrode, the side walls, and the circumferential isolation region are planarized substantially in one plane when the CMP process is completed, the formation of a multi-layer structure from individual elements in the subsequent step of providing an interconnection can be carried out easily. Since the amount removed by the CMP processing is controlled with excellent accuracy, the metal films can surely be isolated from their surrounding regions.

Although there is a concave portion around the center of the W layer 23 of FIG. 2, if the film thickness of the W layer 23 is optimized in accordance with the level of the LOCOS film 2, the planarization of the entire surface of the W layer 23 with no concave portion can be achieved by processing.

The multi-layer metal film 7 as a barrier metal on the impurity diffusion layer 6 is not limited to the above-mentioned composition. It can be a single-layer film composed of any one metal with high melting point and high barriering ability, such as TiW, Co, and Ni, or a multi-layer film composed of a combination of any two or more metals selected from the above. In FIG. 1(e), it is also possible to form a plug from blanket tungsten, aluminum or copper by selective CVD, or a metal film by high-temperature sputtering, instead of forming the W plug 12 by selective CVD.

Figure 3:
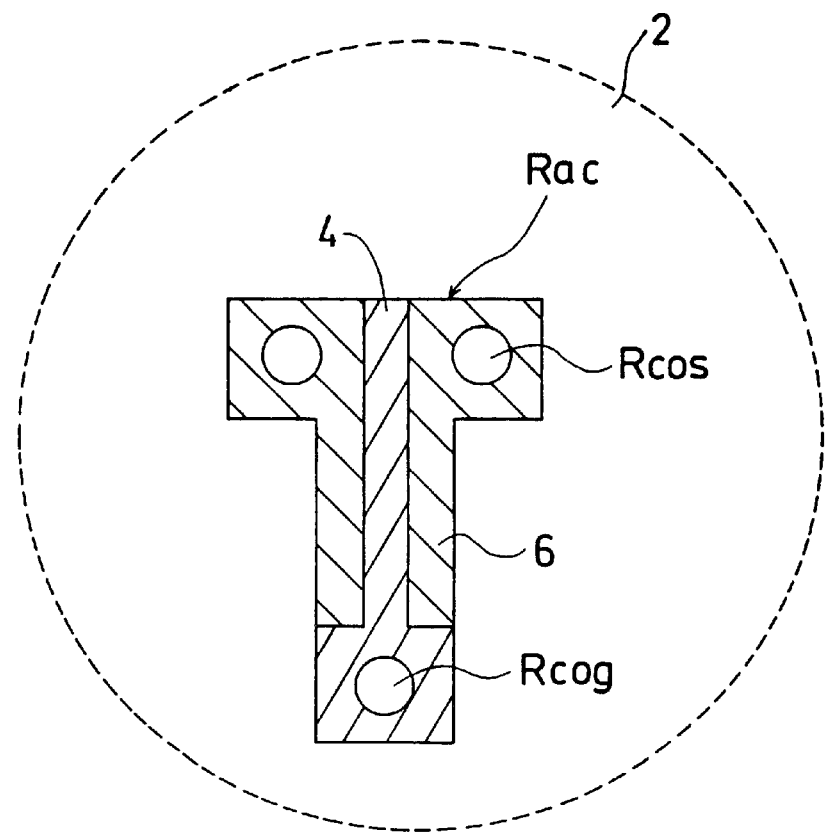
FIG. 3 is a view showing the layout of a MOSFET in the first embodiment.
Figure 4:
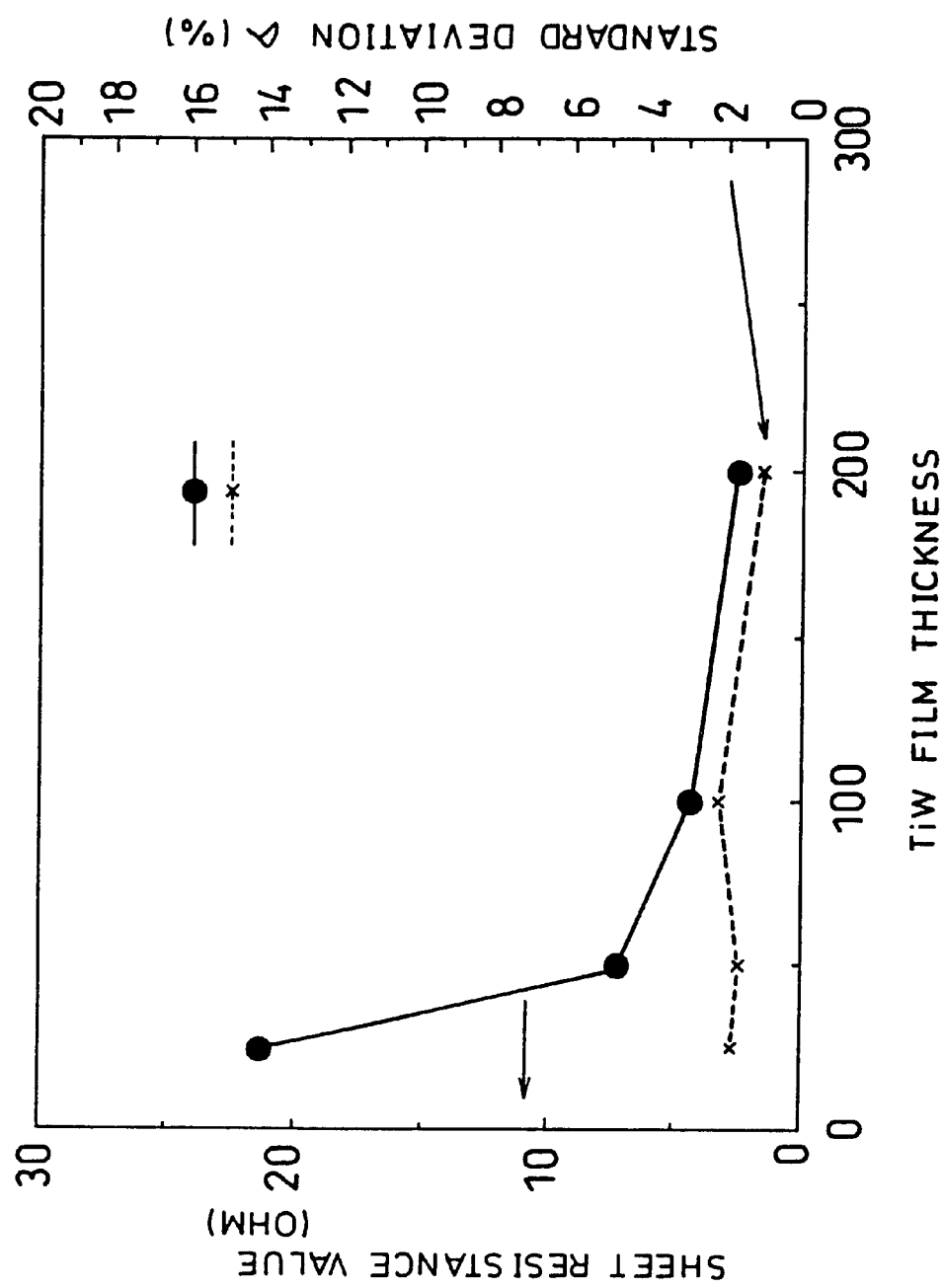
FIG. 4 is a characteristic view showing the dependence of the sheet resistance value of an impurity diffusion layer on the film thickness and its standard deviation in the first embodiment.

FIG. 3 is a plan view of the gate electrode 4 and of the active region Rac on the surface of the silicon substrate 1 in the semiconductor apparatus according to the present embodiment. In the drawing, the silicon active region Rac corresponds to the whole region enclosed by the solid T-shaped box, which is surrounded by the LOCOS film 2. At the center of the silicon active region Rac is formed the gate electrode 4. Each of the silicon active region Rac and the gate electrode 4 is partially increased in width, so as to provide margins for contact regions Rcos and Rcog (see hollow circles in the drawing), which are connected to the first-layer metal interconnection 13. The transistor of the present embodiment, in which the surface of the gate electrode 4 is flush with the surface of the LOCOS film 2, is characterized in that the contact region Rcog is placed in a region of the surface of the silicon substrate 1, not in that portion of the gate electrode 4 overlying the LOCOS film 2. With the above structure, a contact technique whereby the barrier metal layer is deposited prior to the deposition of the W plug is completed.

Next, to evaluate the characteristics cf a transistor obtained by the manufacturing method of the first embodiment, the multi-layer metal film 7 is fabricated by using a TiW film instead of the W/TiN/Ti film used in the above embodiment. The solid circles in FIG. 4 indicate the dependence of the sheet resistance of the impurity diffusion layer 6 on the TiW film thickness and its standard deviation. The data was obtained by forming a thermal oxide film on the silicon substrate 6 inch in diameter, depositing TiW films with different thicknesses of 25 nm, 50 nm, 100 nm, and 200 nm, and then measuring the sheet resistances thereof. As shown in the drawing, the sheet resistance value of the TiW film with a thickness of 100 nm is about 5 Ω, while the sheet resistance value of the TiW film with a thickness of 200 nm is about 2.5 Ω. These values are substantially on the same order as the sheet resistance values of the conventional structure in which the impurity diffusion layer 6 is silicidized ($TiSi_x$). In other words, the manufacturing method of the present embodiment provides a MOSFET having a resistance value on the same order as that of a MOSFET with a so-called "salicide" structure, without silicidizing the impurity diffusion layer.

Figure 5:
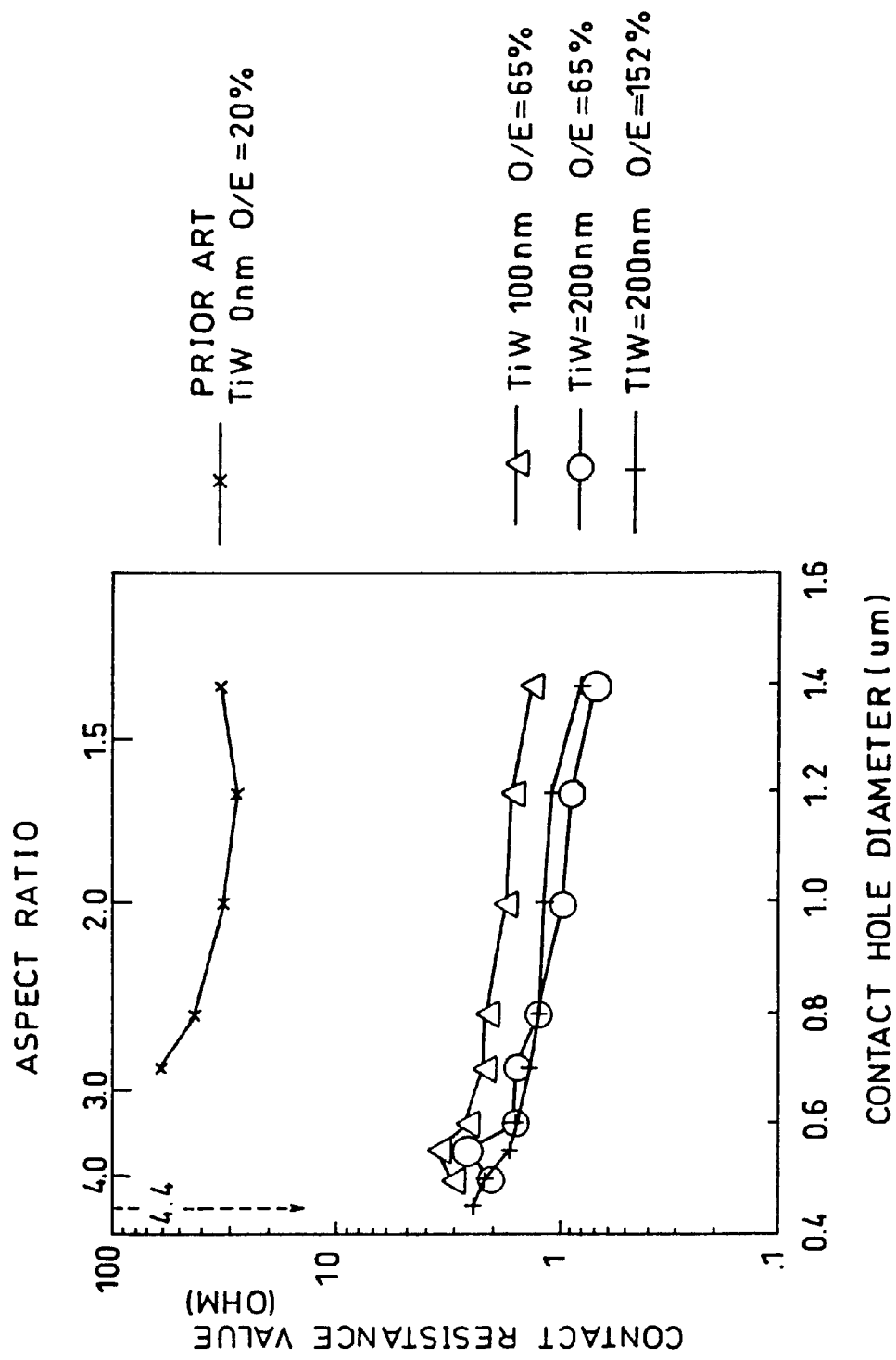
FIG. 5 is a characteristic view showing the dependence of a contact resistance value on a contact hole diameter in the first embodiment.

FIG. 5 shows the dependence of contact resistance on contact hole diameter in the transistor obtained by the manufacturing method of the present embodiment. However, the data was obtained using a transistor in which the contact hole was filled with a W plug of blanket tungsten, instead of the W plug 12 shown in FIG. 1(e) (as adhesion layers, TiN/Ti layers are used), and the first-layer metal interconnection was formed. In this case, the TiW films with different film thicknesses of 0 nm (prior art), 100 nm, and 200 nm are used, while varying the over-etching rate in etching for forming the contact hole in the range of 20 to 152% (calculated based on the etching rate for the low-temperature oxide film 10). It will be appreciated from the data shown in FIG. 5 that, compared with the conventional structure without a TiW film, the structure of the present embodiment provides a small contact resistance for all contact hole diameters and that the resistance value is smaller as the TiW film is thicker. Consequently, if the diameter of the contact hole is set to 4.5 μm and the aspect ratio is set to 4.4, a contact resistance as low as 2.5 Ω can be obtained according to the method of the present embodiment.

Figure 6A:
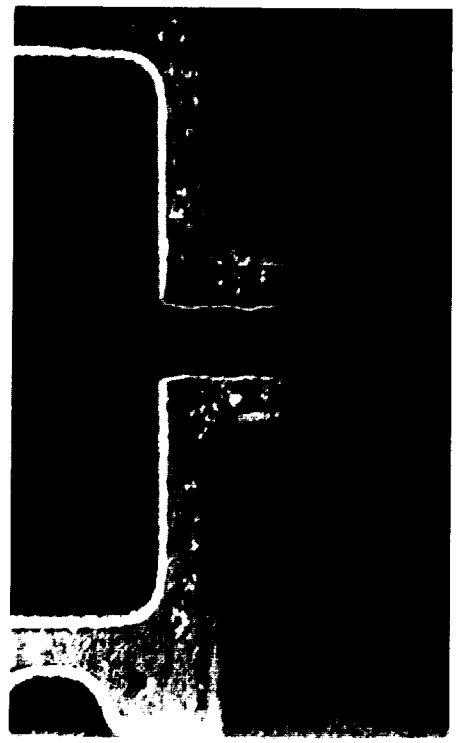
FIGS. 6(a) and 6(b) show and illustrate a SEM photograph of the MOSFET in a plane when the CMP process is completed in the first embodiment.
Figure 6B:
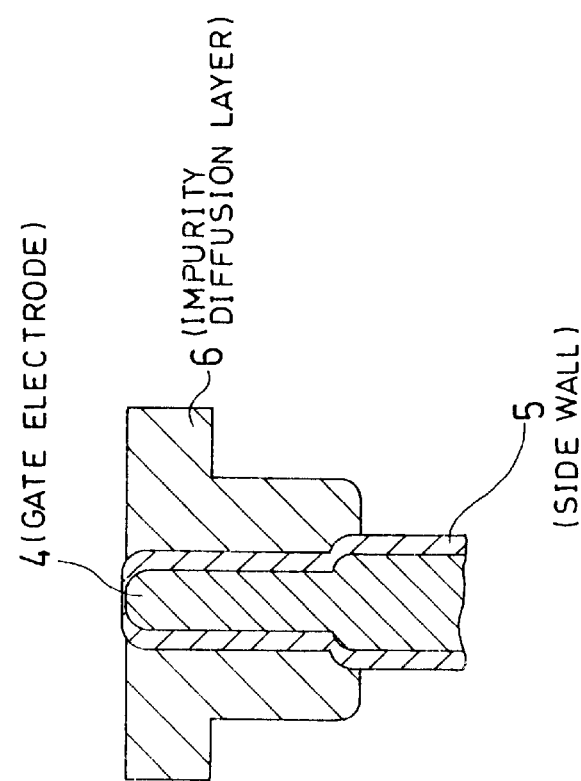

FIG. 6 shows and illustrates a SEM photograph of the transistor in a plane when the CMP process was completed. It will be appreciated from the drawing that the gate electrode 4 and the multi-layer metal film 7 are completely isolated from each other by the side wall 5. The TiW film, which corresponds to the multi-layer metal film 7, is selectively left on the impurity diffusion layer 6, so as to form a low-resistance diffusion layer between the underlying silicon and itself.

(Second Embodiment)

Next, a description will be given to a second embodiment with reference to FIGS. 7(a) to 7(c) and to FIGS. 8 and 9. FIGS. 7(a) to 7(c) are cross sectional views showing the transition of the structure during the process of manufacturing the semiconductor apparatus according to the present embodiment. In FIGS. 7(a) to 7(c), the same reference numerals as used in FIG. 1 designate the same components.

First, as shown in FIG. 7(a), the regular process of manufacturing a device with a polycide gate is followed up to the step of providing a gate interconnection. The gate electrode 4 consisting of a polysilicon film 4a and a silicide (WSi) film 4b has the structure of a so-called polycide gate. As for the method of forming other portions, it is the same as that used in the above first embodiment.

Next, as shown in FIG. 7(b), the W/TiN/Ti film is deposited over the entire surface of the substrate, similarly to the first embodiment, followed by planarization according to the CMP method, thereby forming the multi-layer metal film 7 of W/TiN/Ti. At this stage, the silicide film 4b constituting the gate electrode 4 is simultaneously polished to a certain thickness in accordance with the predetermined thicknesses of the polysilicon film 4a and of the LOCOS film 2.

Next, as shown in FIG. 7(c), the surfaces of the silicide film 4b and of the multi-layer metal film 7 are cleaned by wet cleaning so as to deposit a polysilicon film again, followed by the patterning of the polysilicon film, thereby forming a second polysilicon interconnection 51. The second polysilicon interconnection 51 can be used as a local interconnection and it can also be connected to the silicide 4b and to the multi-layer metal film 7. Since the second polysilicon interconnection 51 is etched by a gas containing Cl as its main component while the silicide 4b and the uppermost W layer of the multi-layer metal film 7 of W/TiN/Ti are functioning as etching stoppers, the second polysilicon interconnection 51 can be formed easily.

Figure 8:
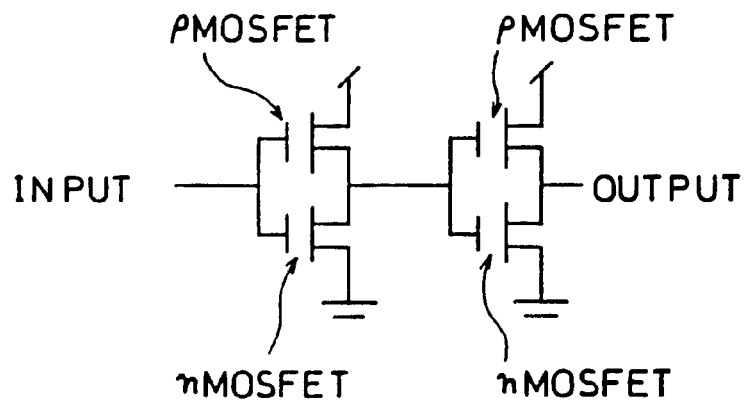
FIG. 8 is an electric circuit diagram of a two-stage inverter consisting of four MOSFETs in the second embodiment.
Figure 9:
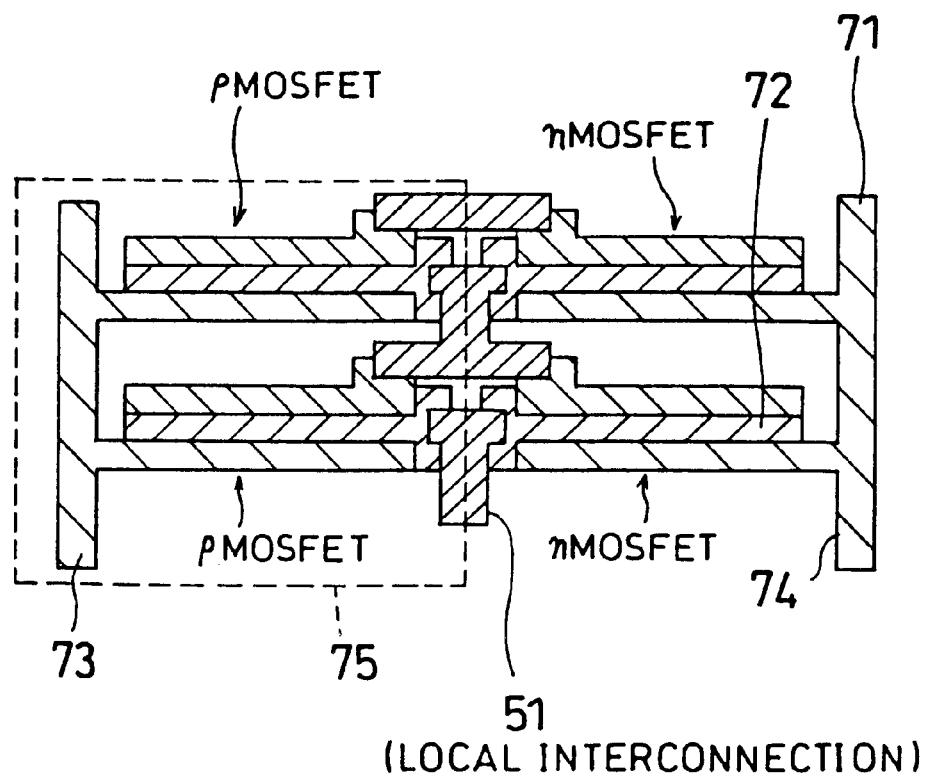
FIG. 9 is a view showing the layout of the two-stage inverter in the second embodiment.

FIG. 8 shows the layout of an inverter chain consisting of an n-channel MOSFET and a p-channel MOSFET, which is provided with the local interconnection of the present process. FIG. 9 is a plan view of the inverter chain of FIG. 8. In FIG. 9, a reference numeral 71 designates an impurity diffusion layer in which a multi-layer metal film of W/TiN/Ti is buried, 72 designates a polycide interconnection having a gate oxide film, and 51 designates the local interconnection using polysilicon (second polysilicon interconnection). A power source 73 and an earth 74 are composed of the impurity diffusion layer 71 in which the multi-layer metal film of W/TiN/Ti is buried. The portion designated by a reference numeral 75 is a p-channel MOSFET. Thus, it is possible to design the layout of an inverter chain or the like by taking advantage of the low resistance of the impurity diffusion layer, without using an aluminum interconnection or the like. Moreover, since contacts are not required, a layout with the minimum area can be designed.

(Third Embodiment)

Next, a description will be given to a third embodiment with reference to FIGS. 10(a) to 10(e) and to FIG. 11. FIGS. 10(a) to 10(e) show the transition of the structure of the semiconductor apparatus according to the present embodiment during the manufacturing process thereof.

Figure 10:
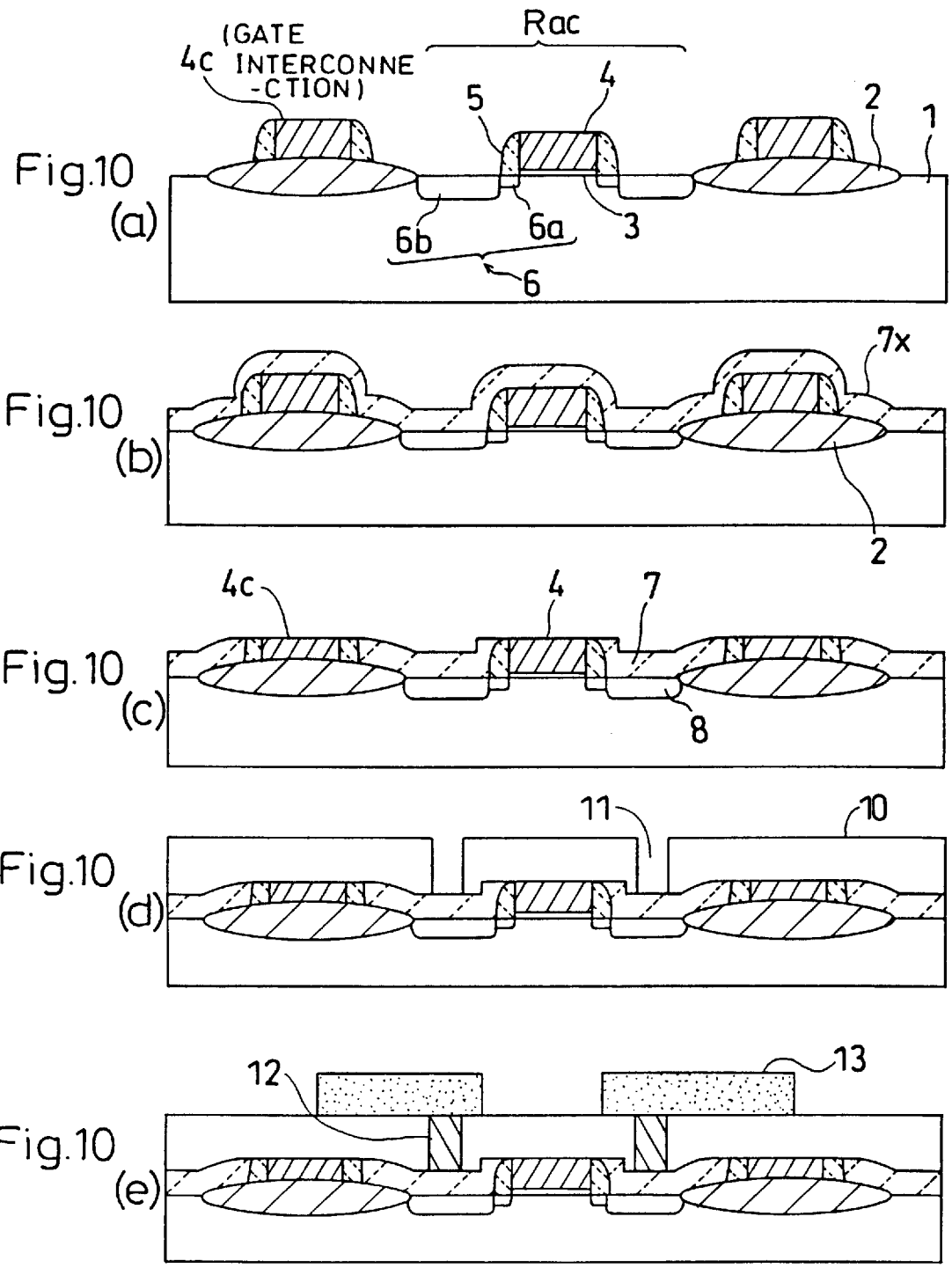
FIGS. 10(a) to 10(e) are cross sectional views showing the transition of the structure of the semiconductor apparatus according to a third embodiment during the manufacturing process thereof.
Figure 11:
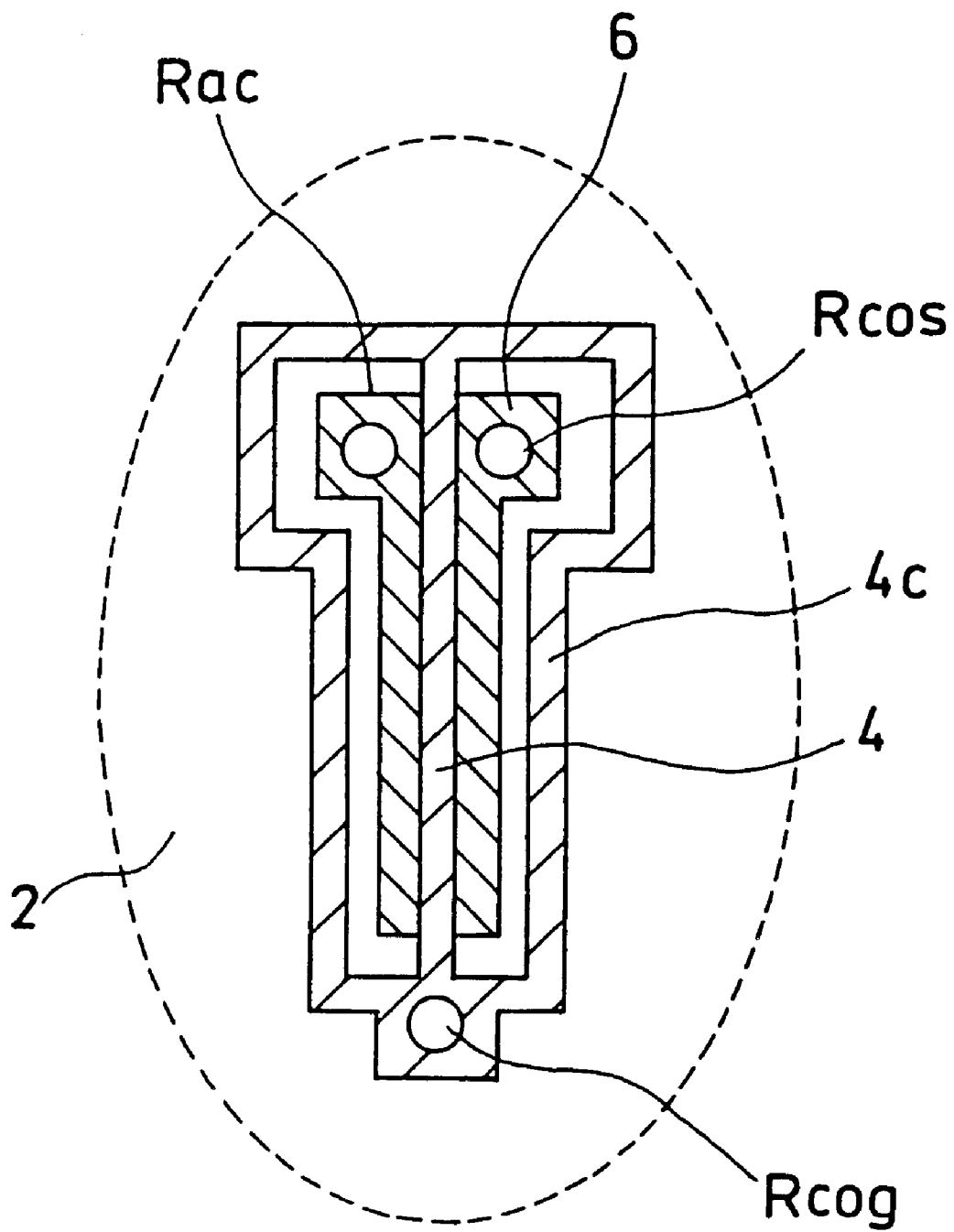
FIG. 11 is a view showing the layout of a MOSFET in the third embodiment.
Figure 12A:
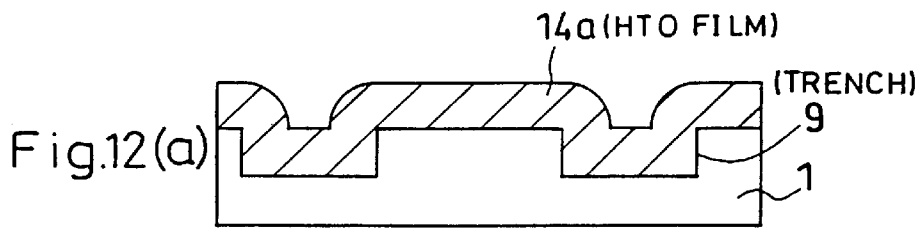
FIGS. 12(a) to 12(f) are cross sectional views showing the transition of the structure of the semiconductor apparatus according to a fourth embodiment during the manufacturing process thereof.
Figure 12B:
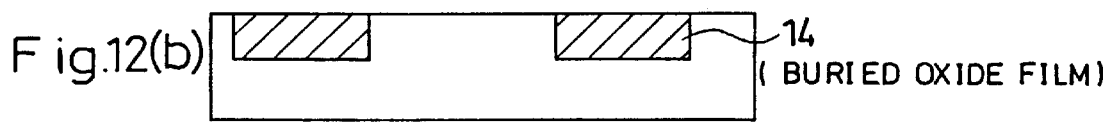
Figure 12C:
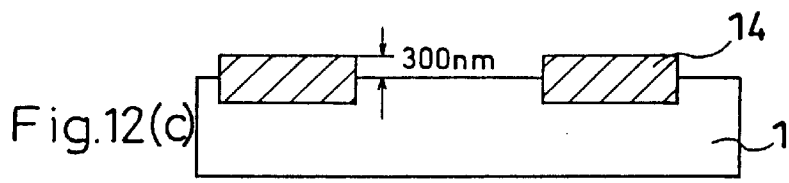
Figure 12D:
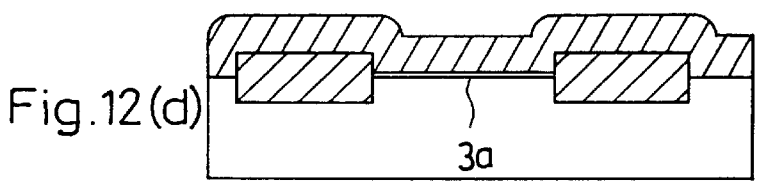
Figure 12E:
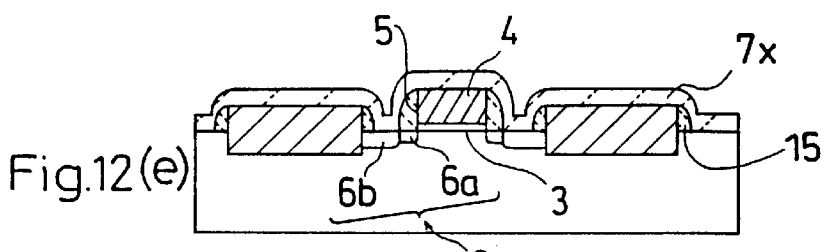
Figure 12F:
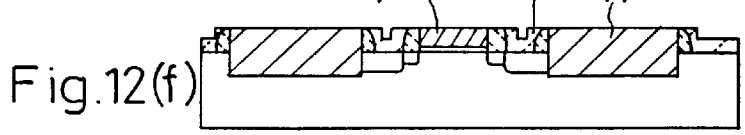

First, as shown in FIG. 10(a), the LOCOS film 2 with a thickness of 500 nm is formed by a LOCOS method using a thermal oxidation furnace for the formation of a LOCOS layer. After conducting the implantation of impurity ions and the thermal treatment suitable for forming the p-channel MOSFET and n-channel MOSFET, a silicon oxide film with a thickness of 10 nm is formed by dry oxidation and then a polysilicon film is formed by LPCVD, followed by a simultaneous patterning of the silicon oxide film and polysilicon film, thereby forming the gate insulating film 3 and gate electrode 4. At that time, the gate interconnections 4c are also left on the LOCOS film 2. The process of forming the impurity diffusion layers 6 and the side walls 5 is the same as that of the above first embodiment, except that the side walls 5c are also formed on both sides of the gate interconnection 4c on the LOCOS film 2 in the present embodiment.

Thus, the present embodiment is characterized in that, while the gate electrode 4a is being formed, the gate interconnection 4c made of polysilicon is also formed on the LOCOS film 2 surrounding the impurity diffusion layers 6.

Next, as shown in FIGS. 10(b) and 10(c), the deposition of the W/TiN/Ti film and the CMP process are conducted in accordance with the same process as used in the above first embodiment except that, in the present embodiment, the surface of the gate electrode 4 is flush with the surface of the gate interconnection 4c on the LOCOS film 2 in a plane when the CMP process is completed and each of the multi-layer metal films 7 is surrounded by the side wall 5 on one side of the gate electrode 4 and the side wall 5c on one side of the gate interconnection 4c, so that the multi-layer metal films 7 are electrically isolated from each other. In other words, the LOCOS film 2 and the side walls 5 of the gate interconnection 4c on the LOCOS film 2 constitute a circumferential isolation region.

In the present embodiment, the proper removal of the W/TiN/Ti film 7x is possible by CMP after selectively forming the W/TiN/Ti film in the region where the gate electrode 4 and polysilicon inter-connection 4c are not formed, utilizing the difference in level of 300 nm between the impurity diffusion layer 6 and polysilicon film (the difference in level between the impurity diffusion layer 6 and the polysilicon film in the isolation is about 450 nm). Although the second polysilicon film composing the gate interconnection 4c is patterned to be left on each isolation, it is also possible to leave a part of the second polysilicon film on the silicon substrate 1 in the active region Rac.

Next, as shown in FIGS. 10(d) and 10e), the low-temperature oxide film 10, contact hole 10, W plug 12, and first metal interconnection 13 are formed in accordance with the same process as used in the above first embodiment. FIG. 11 is a plan view of the MOSFET formed in accordance with the above manufacturing method. At the center of the active region is formed the gate electrode interconnection 4 composed of a polysilicon film. On the LOCOS film 2 is formed the gate interconnection 4c composed of a polysilicon film, which surrounds the active region Rac. On the impurity diffusion layers 6 are formed the multi-layer metal films on both sides of the gate electrode 4, though the drawing thereof is omitted here. Each of the impurity diffusion layer 6 and the gate interconnection 4c is partially increased in width so as to provide margins for forming the contact regions Rcos and Rcog, which are connected to the first-layer metal interconnection.

Unlike the first embodiment the manufacturing method of the present embodiment makes it possible to obtain the contact region Rcog between the first-layer metal interconnection 13 and the gate electrode 4 in the gate interconnection 4c on the LOCOS film.

Compared with the above first embodiment, although the present embodiment requires the formation of the gate interconnection 4c surrounding the active region Rac, it is advantageous in that CMP processing with a wide margin can be performed, since a significant level difference exists between the surface of the second polysilicon film on the LOCOS film 2 and the surface of the silicon substrate 1 in removing the multi-layer metal film 7 of W/TiN/Ti by CMP.
(Fourth Embodiment)

Next, a description will be given to a fourth embodiment with reference to FIGS. 12(*a*) to 12(*f*). FIGS. 12(*a*) to 12(*f*) show the transition of the structure of the semiconductor apparatus according to the fourth embodiment during the manufacturing process thereof.

First, as shown in FIG. 12(*a*), a trench 9 with a depth of 500 nm is formed by photolithography and dry etching in the region in which an isolation for the silicon substrate 1 is to be formed, followed by the deposition of a HTO film 14*a* with a thickness of 600 nm for filling up the trench 9.

Next, as shown in FIG. 12(*b*), the HTO film 14*a* is removed by CMP so that it remains only in the trench 3 at the final stage and serves as the buried oxide film 14.

Next, as shown in FIG. 12(*c*), the silicon substrate 1 is etched using a silicon etchant in order to provide a specified level difference between the surface of the silicon substrate 1 and the surface of the buried oxide film 14. Eventually, the level of the silicon substrate 1 is lowered to 3.0 nm below the level of the buried oxide film. At the end of the foregoing process, an isolation composed of the buried oxide film 14 which is 300 nm higher in level than the surface of the silicon substrate 1 is formed.

Next, as shown in FIG. 12(*d*), a silicon oxide film 3*a* is formed only on the silicon surface by dry oxidation and then the polysilicon film 4*a* is deposited in the subsequent step.

Figure 2:
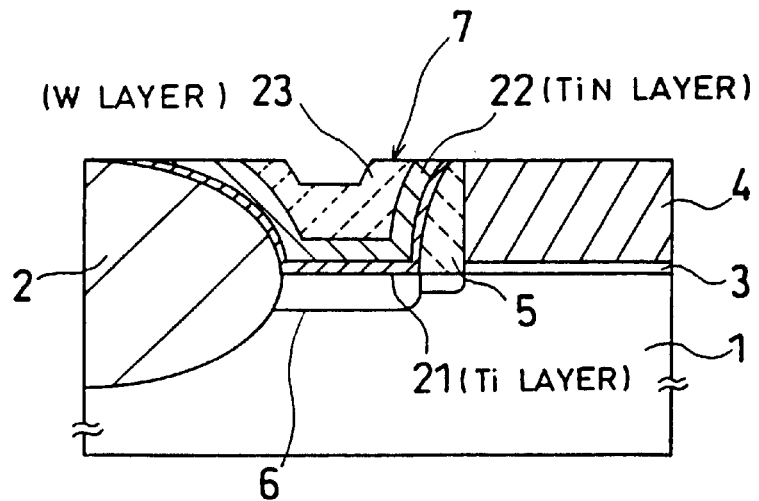
FIG. 2 is an enlarged cross sectional view partially showing the semiconductor apparatus in the step of FIG. 1(f)

Next, as shown in FIG. 12(*e*), the gate oxide film 3, the gate electrode 5, the side walls 5 on both sides of the gate electrode 4, the impurity diffusion layers 6 each consisting of the n$^+$ region and n$^-$ region, and the W/TiN/Ti film 7*x* are formed in the same process as shown in FIGS. 1(*b*) and 1(*c*) of the above first embodiment, except that the side walls 15 are also formed on both sides of the buried oxide film 14 in the present embodiment.

Then, as shown in FIG. 12(*f*), the W/TiN/Ti film 7*x* on the buried oxide film layer 14 and on the gate electrode 4 is removed so that the multi-layer metal films 7 of W/TiN/Ti remain only on the impurity diffusion layers 6.

Next, the low-temperature oxide film, contact hole, W plug, first-layer interconnection are formed in accordance with the same process as shown in FIGS. 1(*e*) and 1(*f*), though the drawing thereof is omitted here.

Since the manufacturing method of the present embodiment uses a box-shaped isolation, a large level difference between the top-surface of the isolation and the surface of the silicon substrate can be obtained more easily than with the isolation formed by the LOCOS method in the above first embodiment. Consequently, it becomes possible to process a barrier metal by CMP with a wider margin.
(Fifth Embodiment)

Next, a description will be given to a fifth embodiment with reference to FIG. 13.

In the conventional manufacturing process, in general, the characteristics of a transistor can be measured only after the formation of a first-layer Al interconnection. To construct a process or to detect a failure during manufacturing, however, it is preferable to measure the transistor characteristics before forming the Al interconnection. The manufacturing method of the present embodiment enables the measurement of the transistor characteristics prior to the formation of the Al interconnection.

Figure 13:
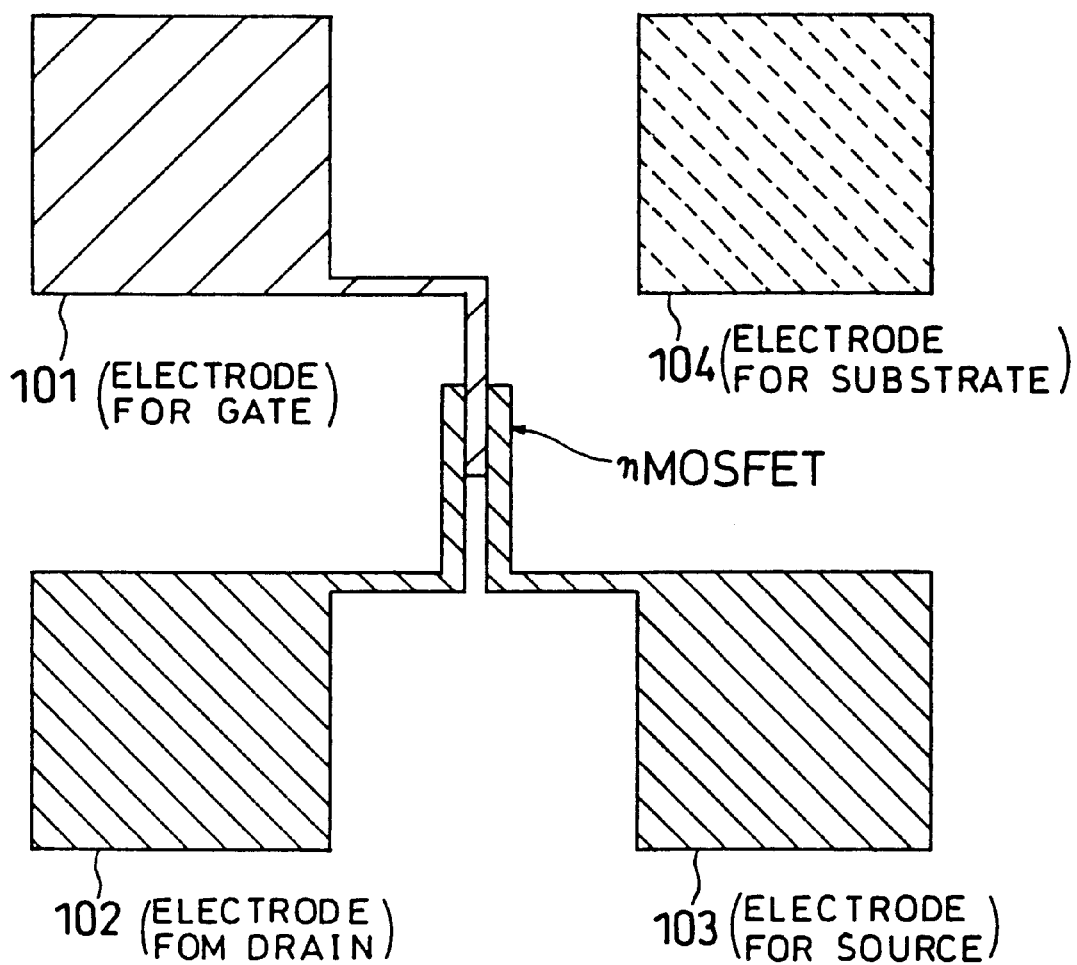
FIG. 13 is a view showing the layout of a MOSFET with a measurement pad terminal in a fifth embodiment.

FIG. 13 shows a plan view of a test pattern for measuring the characteristics of the MOSFET disposed on the silicon substrate. The drawing shows a flat configuration of the test pattern when the MOSFET is in the step of FIG. 1(*c*) of the above first embodiment where the W/TiN/Ti film 7*x* is subjected to CMP processing so as to form the multi-layer metal film 7. In FIG. 13, a reference numeral 101 designates an electrode for gate, 102 designates an electrode for drain, 103 designates an electrode for source, and 104 designates an electrode for substrate. At the center of the drawing is formed an n-channel MOSFET, surrounded by the above electrodes. The electrode 103 for source and the electrode 102 for drain are connected to the two multi-layer metal films 7 of W/TiN/Ti remaining on the impurity diffusion layers of the silicon substrate 1, respectively. The electrode 101 for gate is connected to the gate electrode 4 composed of a polysilicon film, which is formed on the gate oxide film. Each of the electrodes 101 to 104 is deposited above the active region and surrounded by the LOCOS film.

With the above test pattern, the characteristics of the n-channel MOSFET can be measured by providing each of the electrodes 101 to 104 with a probe needle. Although each of the electrodes 101 to 104 is placed above the active region, since it is covered with the polysilicon film and tungsten film which are comparatively strong, the silicon substrate is not damaged even when the probe needle is brought in contact with it. Moreover, since the sheet resistances of the electrodes 102 and 103 are low, the resistive component loaded on the source/drain region can be suppressed.

Thus, with the manufacturing method of the present embodiment, it becomes possible to detect the characteristics of a transistor before forming the inter-layer insulating film or Al interconnection in the first layer. As a result, the relationship between the manufacturing conditions and characteristics of a transistor can be understood promptly as well as a failure in the process can be detected at an early stage.
(Sixth Embodiment)

Figure 15:
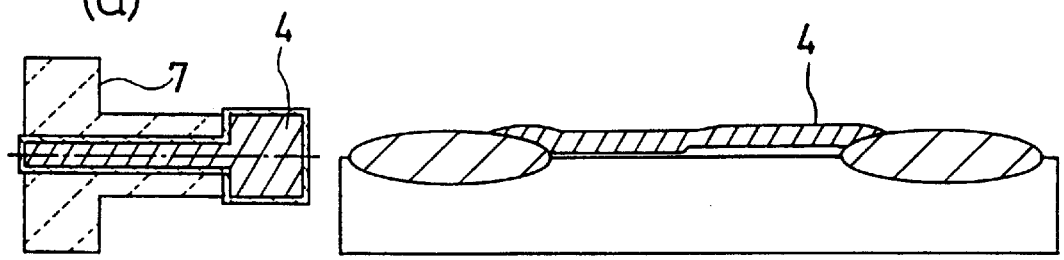
FIGS. 15(a) to 15(c) are plan views and cross sectional views showing the transition of the structure of the semiconductor apparatus according to the sixth embodiment in the manufacturing process thereof after the side walls of the gate electrode were formed.
Figure 15:
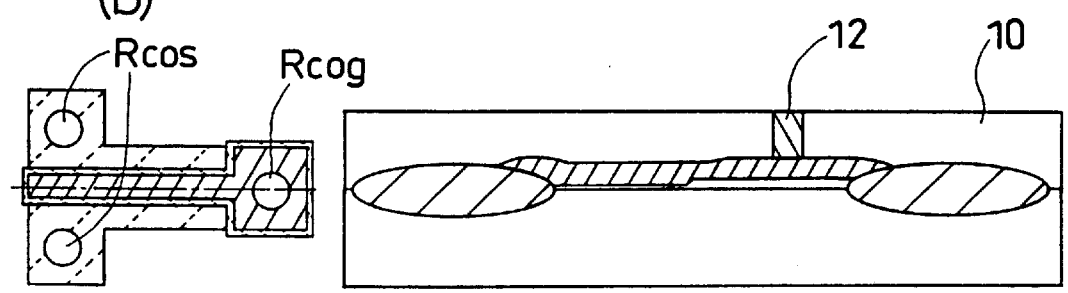
Figure 15:
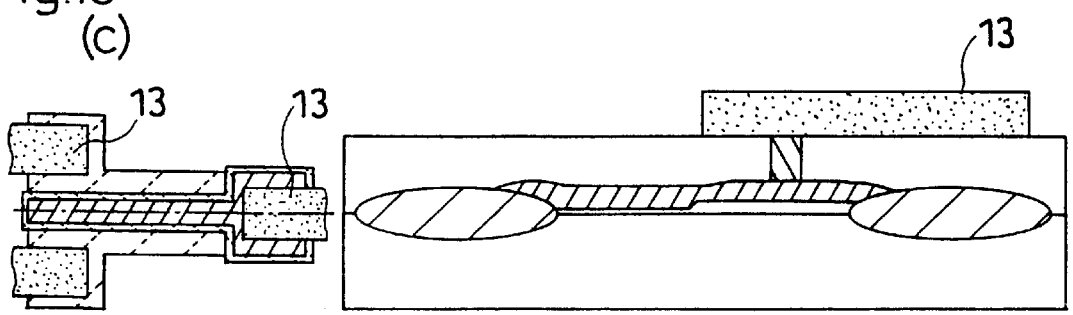
Figure 16:
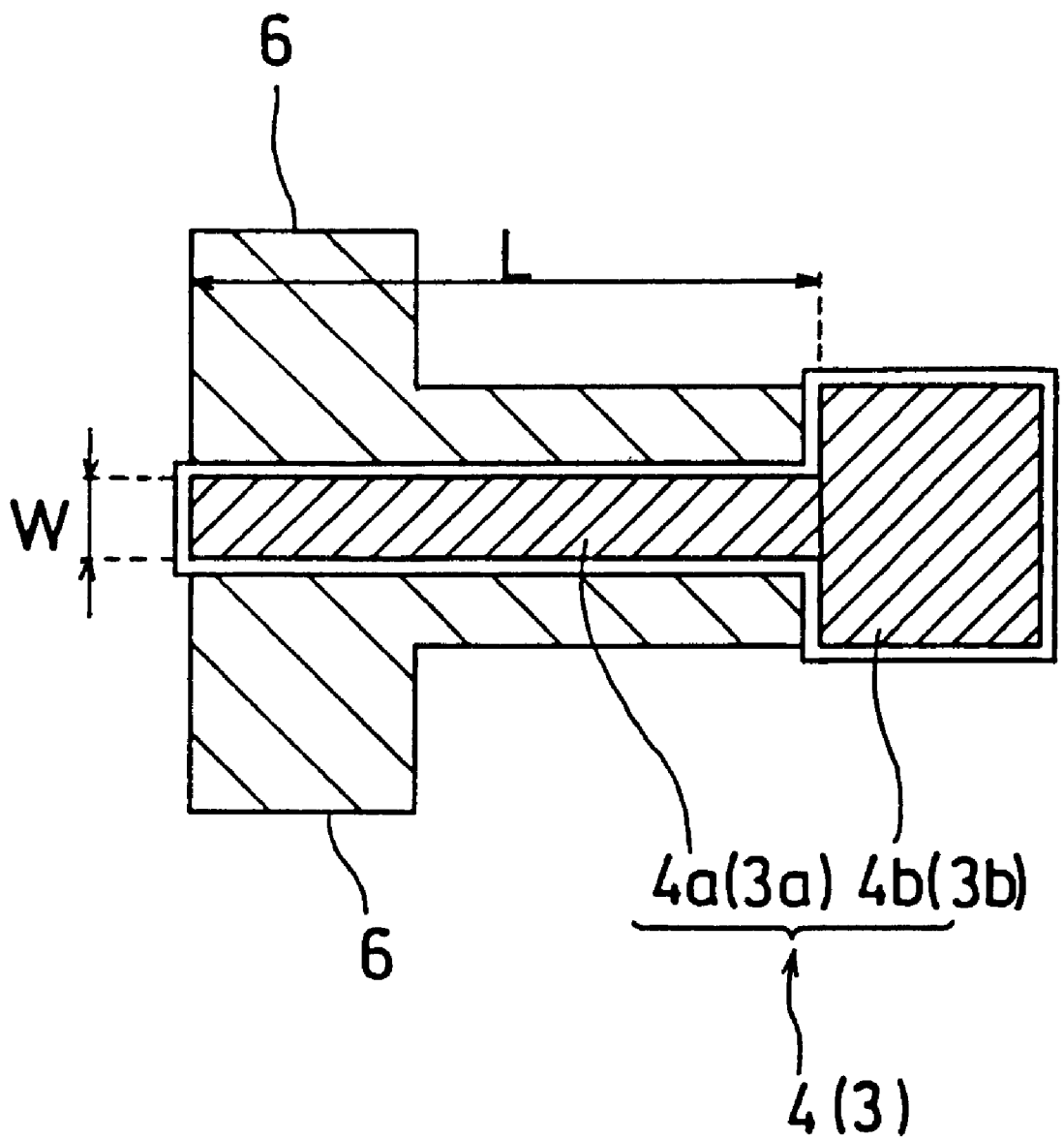
FIG. 16 is a plan view showing the structure of the MOSFET in the semiconductor apparatus according to the sixth embodiment.

Next, a description will be given to a sixth embodiment with reference to FIGS. 14(*a*) to 14(*e*), to FIGS. 15(*a*) to 15(*c*), and to FIG. 16.

Figure 14:
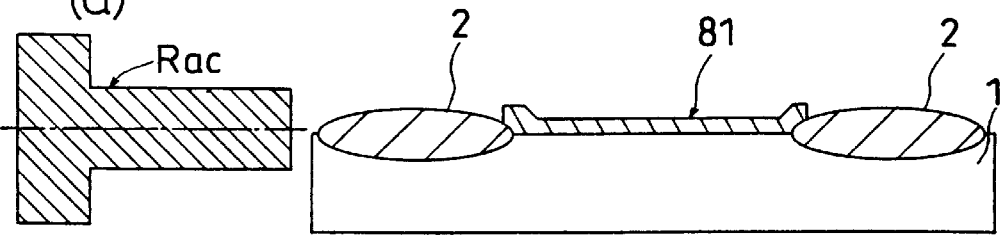
FIGS. 14(a) to 14(e) are plan views and cross sectional views showing the transition of the structure of the semiconductor apparatus according to a sixth embodiment during the manufacturing process thereof before side walls of a gate electrode are formed.
Figure 14:
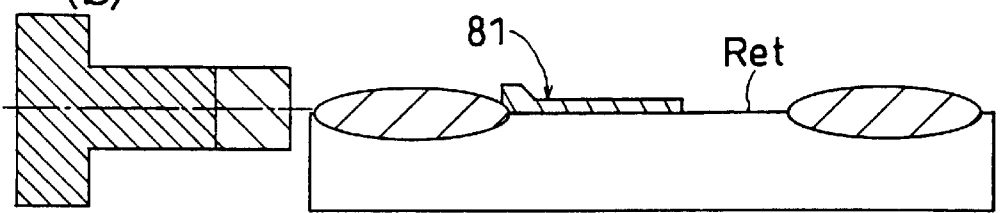
Figure 14:
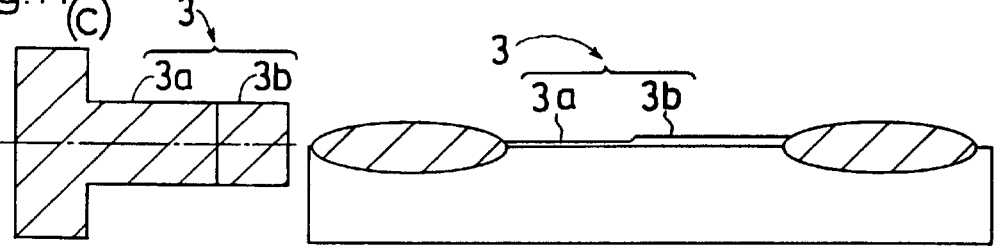
Figure 14:
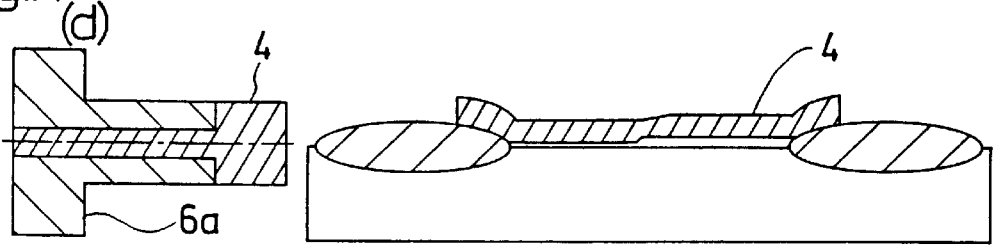
Figure 14:
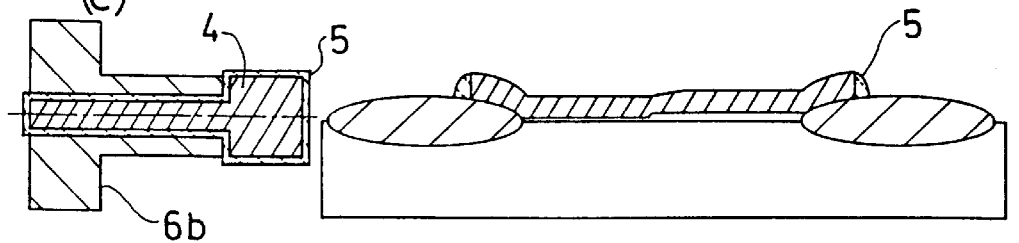

FIGS. 14(*a*) to 14(*e*) show the transition of the structure of the semiconductor apparatus according to the sixth embodiment during the manufacturing process thereof. In FIGS. 14(*a*) to 14(*e*) and FIGS. 15(*a*) to 15(*c*), the left-hand views are plan views of elements in each of the active regions. Here, only the structure of one active region is shown for convenience, which is surrounded by the LOCOS film. In FIGS. 14(*a*) to 14(*e*) and FIGS. 15(*a*) to 15(*c*), the right-hand views are cross-sectional views of the semiconductor apparatus taken along the dash-dot lines in the left-hand views.

First, as shown in FIGS. 14(*a*) and 14(*b*), an anti-oxidant film 81 composed of a $Si_3N_4$ film is formed in the region in which the active region is to be formed. Then, only the silicon substrate 1 in the opening formation region of the anti-oxidant film 81 is subjected to thermal oxidation, thereby forming the LOCOS film 2 with a thickness of 500 nm. Thereafter, the anti-oxidant film 81 is partially etched away (region Ret of FIG. 14(*b*)).

Next, as shown in FIG. 14(*c*), a thin gate oxide film 3*a* (with a thickness on the order of 10 nm) and a thick gate oxide film 3*b* (with a thickness on the order of 100 nm) are formed by two thermal oxidations. During the two thermal oxidation processes: only the surface of the silicon substrate 1 in the region Ret without the above anti-oxidant film 81 is subjected to thermal oxidation so as to form the thick silicon oxide film; the anti-oxidant film 81 is completely removed; and thermal oxidation is performed again.

Next, as shown in FIG. 14(d), a polysilicon film or polycide film is deposited on the gate oxide film 4, followed by the patterning of the resulting film together with the gate oxide film 3, thereby forming the gate electrode 4. In this step, the whole thick gate oxide film 3b is left and covered with the gate electrode 4, while the thin gate oxide film 3a is removed except for the center portion thereof. Then, impurity ions at a low concentration are implanted from above so as to form the low-concentration source/drain region 6a.

Next, as shown in FIG. 14(e), a HTO film is deposited over the entire substrate. followed by anisotropic etching, thereby forming the side walls 5 on both sides of the gate electrode 4. After that, impurity ions at a high concentration are implanted from above so as to form the high-concentration source/drain region 6b.

Next, as shown in FIG. 15(a), the W/TiN/Ti film is deposited and the CMP process is performed in accordance with the same process as used in the above first embodiment, thereby leaving the multi-layer metal films 7 on both sides of the gate electrode 4. In this case, however, a TiW film may be used instead of the W/TiN/Ti film.

Next, as shown in FIGS. 15(b) and 15(c), the low-temperature oxide film 10, contact hole 10, W plug 12, and first-layer metal interconnection 13 are formed in accordance with the same process as used in the above first embodiment. In the right-hand views of FIGS. 15(b) and 15(c), however, the first-layer interconnection 13 is superimposed on the pattern configuration beneath the low-temperature oxide film 10 for the sake of clarity. In other words, the low-temperature oxide film 10 is treated as a transparent body.

Next, a description will be given to the advantage in the characteristics of the semiconductor apparatus according to the present embodiment with reference to FIG. 16. FIG. 16 is a plan view of a transistor formed in accordance with the manufacturing method of the present embodiment, of which only the gate electrode 4 and impurity diffusion regions 6 are shown for convenience. As shown in the drawing, the transistor consists of the two impurity diffusion regions 6 functioning as the source/drain region, the gate electrode 4a interposed therebetween, and the thin gate oxide film 3a immediately below the gate electrode 4a. Hence, the transistor can be considered as a MOSFET with a transistor length L and with a transistor width W shown in FIG. 16. On the other hand, that portion of the gate electrode 4b placed on the thick gate oxide film 3b does not function as a transistor. In the gate oxide film 3b which is ten times as thick as the thin gate oxide film 3a (100 nm), the capacitance which supposedly affects the operating speed of the transistor can be estimated to be 1/10 the capacitance of the thin gate oxide film 3a. Consequently, the operating speed is increased compared with a transistor having the gate oxide film with a uniform thickness. In other words, the present embodiment has the advantage of increasing the operating speed due to the reduction of the capacity, in addition to the advantage of lowering the resistance value of the impurity diffusion region similarly to the above first embodiment.

(Seventh Embodiment)

Next, a description will be given to a seventh embodiment with reference to FIGS. 17(a) to 17(d), which show the transition of the cross sectional structure of the semiconductor apparatus according to the seventh embodiment during the manufacturing process thereof. Since the transition of the cross sectional structure can easily be estimated from the above sixth embodiment, only the transition of the two-dimensional structure in the active region is shown here.

Figure 17A:
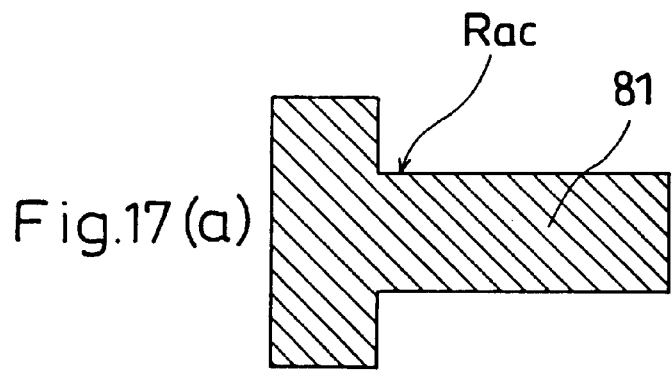
FIGS. 17(a) to 17(d) are plan views showing the transition of the structure of the semiconductor apparatus according to a seventh embodiment during the manufacturing process thereof.
Figure 17B:
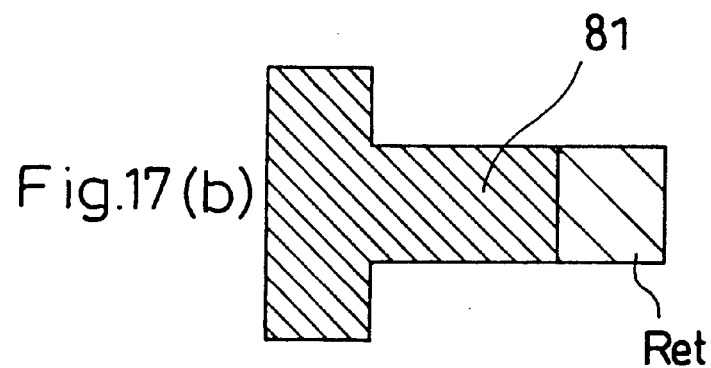

First, as shown in FIGS. 17(a) and 17(b), the same process as used in the above sixth embodiment is performed here. That is, the anti-oxidant film 81 composed of the $Si_3N_4$ film and the LOCOS film (not shown) surrounding the active region Rac are formed, and then the resulting anti-oxidant film 81 is partially etched away (region Ret of FIG. 17(a)).

Figure 17C:
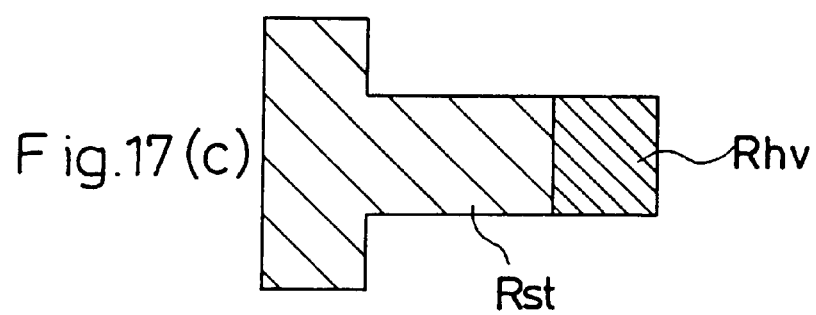

Next, as shown in FIG. 17(c), impurity ions for increasing the threshold voltage Vt over the power-source voltage are implanted into the region Ret without the anti-oxidant film 81 (region Rhv of FIG. 17(c)). Subsequently, the anti-oxidant film 81 is removed and then a thermal oxide film is formed, followed by the implantation of impurity ions for threshold control into the entire active region Rac, thereby turning all the regions except the above region Rhv into the normal threshold region Rst. Specifically, if the transistor to be formed is an n-channel MOSFET, phosphorus ions at a low concentration are preliminarily implanted into the region without the anti-oxidant film 81, followed by the implantation of boron ions into the entire active region Rac. Accordingly, the concentration of majority carriers is lowered by counter doping the region Rhv with an impurity, which increases the threshold after the formation of the transistor in the region Rhv.

Figure 17D:
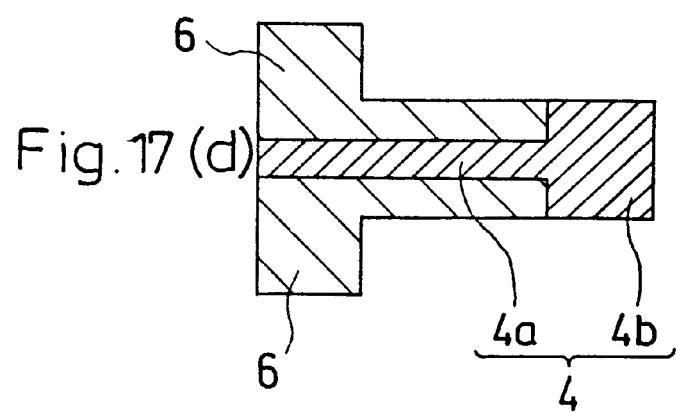

Thereafter, the same process as used in the above sixth embodiment (see FIGS. 14(d) and 14(e)) is performed, thereby forming the transistor shown in FIG. 17(d).

In the present embodiment, the transistor is composed of the gate electrode 4a, the impurity diffusion regions 6 on both sides of the gate electrode 4a, and the gate oxide film 3 immediately below the gate electrode 4a, while the gate electrode 4b in the high-threshold region Rhv does not function as a transistor. Since a depletion layer extends widely in the low-threshold region Rhv beneath the gate electrode 4b even when the transistor is operating, the same effect as obtained when the thickness of the gate oxide film is increased can be achieved, thereby reducing the capacitance. Consequently, the present embodiment also provides the same effect as obtained in the above sixth embodiment.

(Eighth Embodiment)

Next, a description will be given to an eighth embodiment with reference to FIGS. 19(a) to 19(e), FIG. 20, FIG. 21, FIG. 22, and FIGS. 23(a) to 23(c).

Figure 19A:
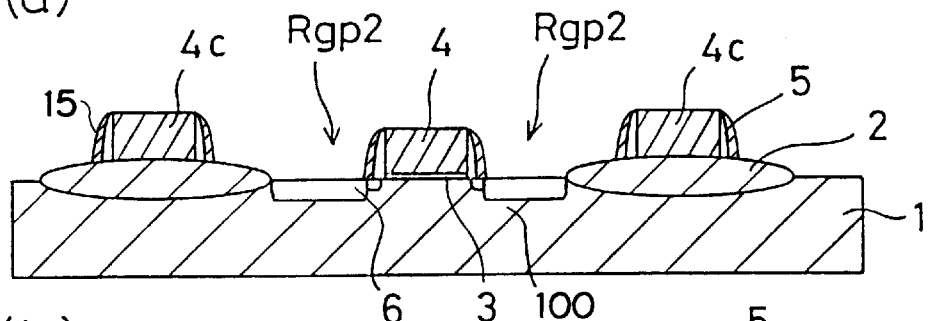
FIGS. 19(a) to 19(e) are cross sectional views of a wafer illustrating the manufacturing process of the semiconductor apparatus according to an eighth embodiment.

First, as shown in FIG. 19(a), the LOCOS film 2 for isolating individual transistors formed on the silicon substrate 1 is formed in a thermal oxidation furnace to a thickness of about 300 nm. After conducting ion implantation and thermal treatment suitable for forming the p-channel MOSFET and n-channel MOSFET, the gate oxide film 3 with a thickness of 10 nm is formed by dry oxidation and then a polysilicon film is formed by LP-CVD, followed by photolithography and dry etching, thereby forming the gate electrode 4 from the polysilicon film over the active region and the gate interconnections 4c on the LOCOS film 2. Up to this stage, first interspaces Rgp1 each of which is smaller in width than a specified value T and a second interspace Rgp2 which is larger in width than the specified value T have been formed between the gate electrode 4 and the gate interconnections 4c on the LOCOS film 2, as. shown in FIG. 20. In other words, in the state prior to the formation of the side walls 5 for LDD as shown in the plan view of FIG. 20, each of the two regions surrounded by one gate electrode 4 and the gate interconnections 4c on both sides thereof is composed of two end portions on the LOCOS film 2, which correspond to the narrower first interspaces Rgp1, and of a central portion over the active region 100 and a part of the LOCOS film 2, which corresponds to the wider second interspace Rgp2. The first interspaces Rgp1 include sufficiently large spaces for the formation of contacts with the upper interconnections.

Here, the above specified value T is defined as a critical value in determining whether the interspaces are buried with the side walls 5 for LDD and with the sidewalls 15 for isolation to be formed in the subsequent step or the base is exposed. The specified value T corresponds to double the sum of the thicknesses of the individual side walls. In the case of not forming the side walls for LDD, the specified value T corresponds to double the thickness of the side wall for isolation.

Thereafter, ion implantation suitable for forming a transistor of LDD structure is conducted and then a HTO film is deposited over the entire surface by LP-CVD, followed by highly anisotropic dry etching, thereby forming the side walls 5 for LDD composed of an oxide film on the side faces of the gate electrode 4. Subsequently, ion implantation is conducted with a high dose so as to form diffusion layers 6 (high-concentration source/drain) in the active region 100, followed by activation at an appropriate temperature. Up to this stage, the present embodiment has been compliant with a conventional standard method of forming a MOS transistor, except that the polysilicon film is patterned so as to form the gate electrode 4 over the active region 100 and a part of the LOCOS film 2 and to simultaneously form the gate interconnections 4c isolated from the gate electrode 4 on the LOCOS film 2, which characterizes the present embodiment. The resulting gate electrode 4 and gate interconnections 4c function as first conductive interconnections.

Figure 19B:
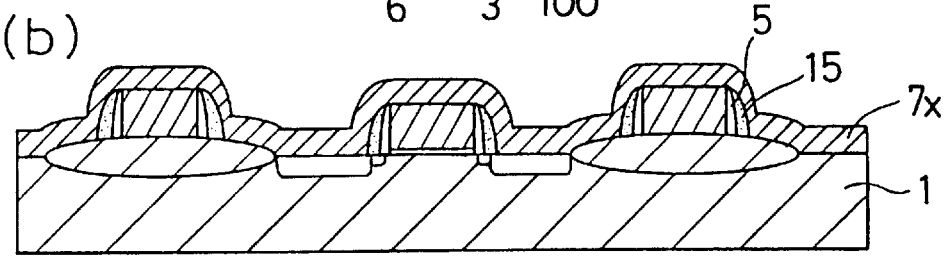
Figure 21:
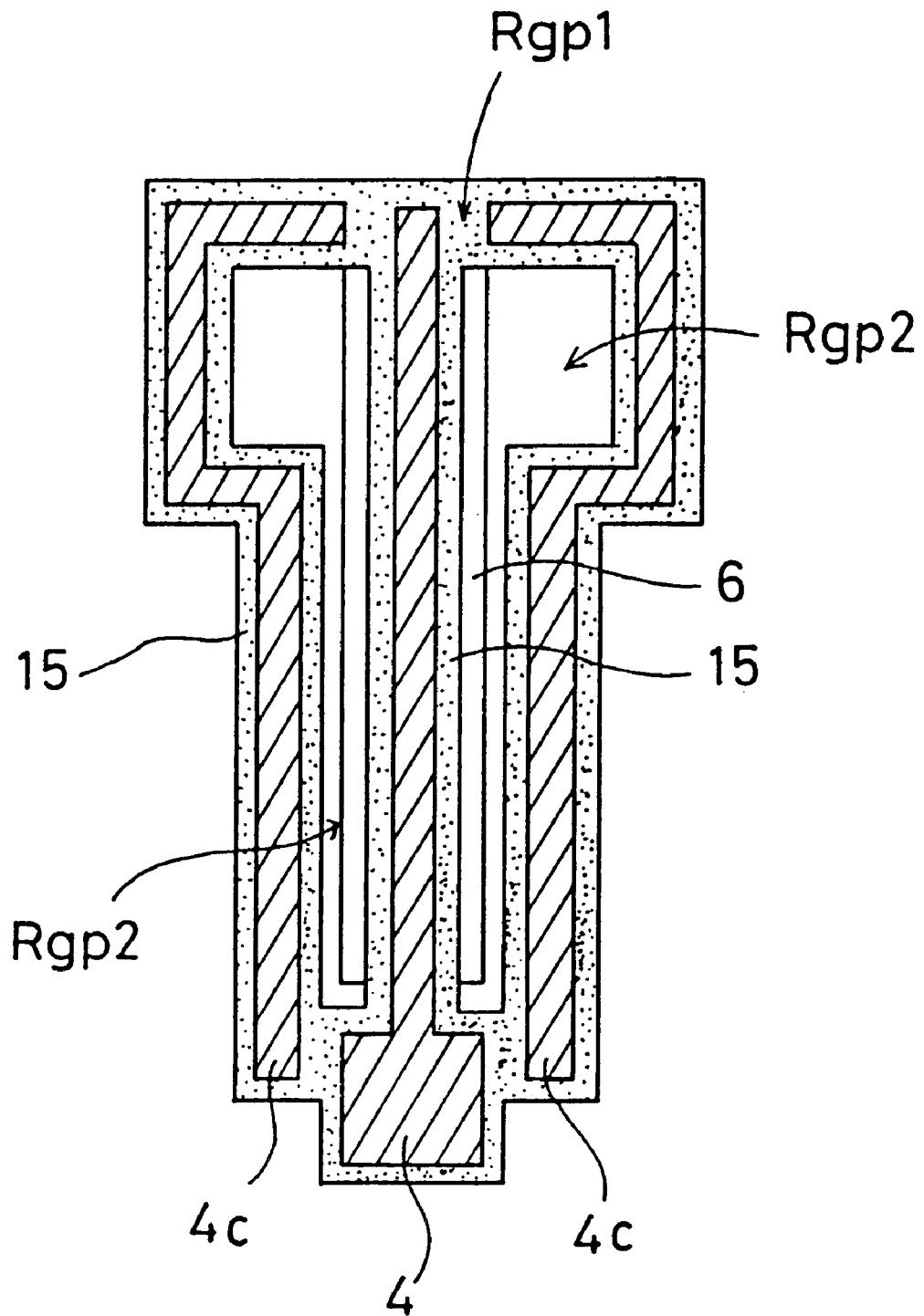
FIG. 21 is a plan view of the wafer after the step of forming the side walls in the manufacturing process of the semiconductor apparatus according the eighth embodiment.

Next, as shown in FIG. 19(b), the HTO film is deposited over the entire surface of the substrate and then subjected to anisotropic etching, thereby forming the side walls 15 for isolation on the side walls 5 for LDD. At this stage, as shown in FIG. 21, the first interspaces Rgp1 between the gate electrode 4 and the gate interconnections 4c are buried completely with the HTO film. In the second interspaces Rgp2, however, the surfaces of the active region 100 and of the LOCOS film 2 are exposed. The second interspaces Rgp2 are isolated from the exterior of the gate interconnections 4c with the first interspaces Rgp1 buried with the HTO film.

Next, sputtering is performed after a dip etching process using an etchant containing HF as its main component, so as to sequentially deposit a Ti film with a thickness of 10 nm and a TiN film with a thickness of 30 nm. After that, further sputtering is performed so as to deposit a W film with a thickness of 100 nm, thereby forming a multi-layer metal film 7x composed of W/TiN/Ti. Of the multi-layer metal film 7x, the TiN/Ti layers function as adhesion layers for the overlying W layer, while they have the function of lowering the resistance of the interface with the underlying silicon substrate 1. On the other hand, the W layer has the function of lowering the resistance of the impurity diffusion layers 6, the function of preventing the oxide film from being over-etched in the case of contact etching, and the function as a barrier metal. Since the sputtering of the TiN/Ti layers is performed with respect to a geometry with a small aspect ratio, excellent step coverage is achieved.

Figure 19C:
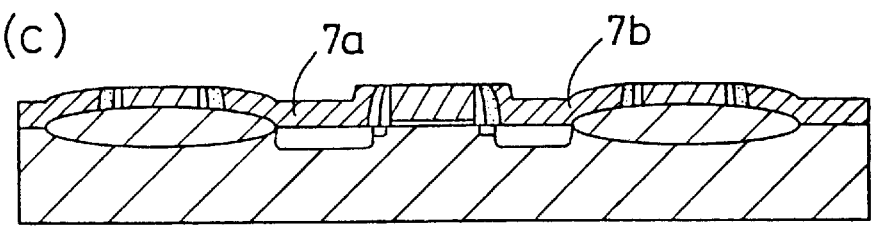

Next, as shown in FIG. 19(c), the multi-layer metal film 7x is removed using CMP for metal till both of the gate electrode 4 and gate interconnections 4c become exposed, thereby isolating the multi-layer metal films 7x, which will function as the source electrode 7a and the drain electrode 7b, in the two respective second interspaces Rgp2 shown in FIG. 21. Since the difference in level between the diffusion layers 6 and the gate electrode 4 is 300 nm and the difference in level between the diffusion layers 6 and the gate inter-connections 4c on the LOCOS film is about 450 nm, such processing as forming the source/drain electrodes 7a and 7b from the multi-layer metal film 7x can be performed easily. The source/drain electrodes 7a and 7b function as second conductive interconnections.

Figure 19D:
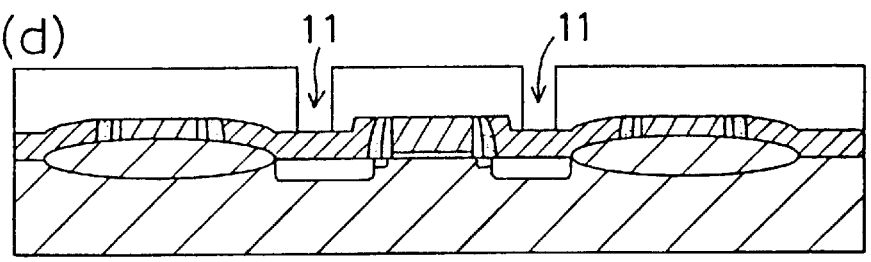

Next, as shown in FIG. 19(d), the low-temperature oxide film 10 (USG film formed by CVD under ordinary pressure) is deposited to a thickness of about 500 nm, followed by the formation of the contact holes 11 therein by performing photolithographic and dry-etching processes. Since the underlying source/drain electrodes 7a and 7b protect the active region 100 (silicon surface) in the dry-etching process, a sufficient margin against over-etching the low-pressure oxide film 10 is obtained advantageously. Alternatively, if the contact holes 11 are formed in positions above the LOCOS film 2, there is no risk of damaging the active region 100.

Figure 19E:
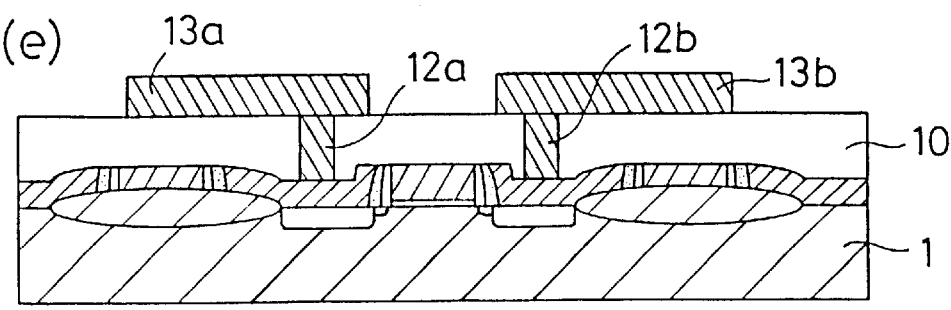

Next, as shown in FIG. 19(e), W (tungsten) is buried in the contact holes 11 by selective CVD so as to form contact portions 12a and 12b, while simultaneously forming a contact portion 12c of the gate electrode 4, though the drawing thereof is omitted here. Since the underlying layers are composed of W corresponding to the uppermost layers of the source/drain electrodes 7a and 7b, W is deposited selectively on W. Accordingly, the reaction during the CVD process does not cause any damage to the silicon substrate or to the silicon dioxide film, which might have been caused in a conventional embodiment.

Finally, a TiN/AlSiCu/Ti film is deposited as shown in FIG. 19(f) and then subjected to photolithographic and dry-etching processes so as to pattern the TiN/AlSiCu/Ti film. thereby forming first-layer metal interconnections 13a, 13b, . . . .

Figure 22:
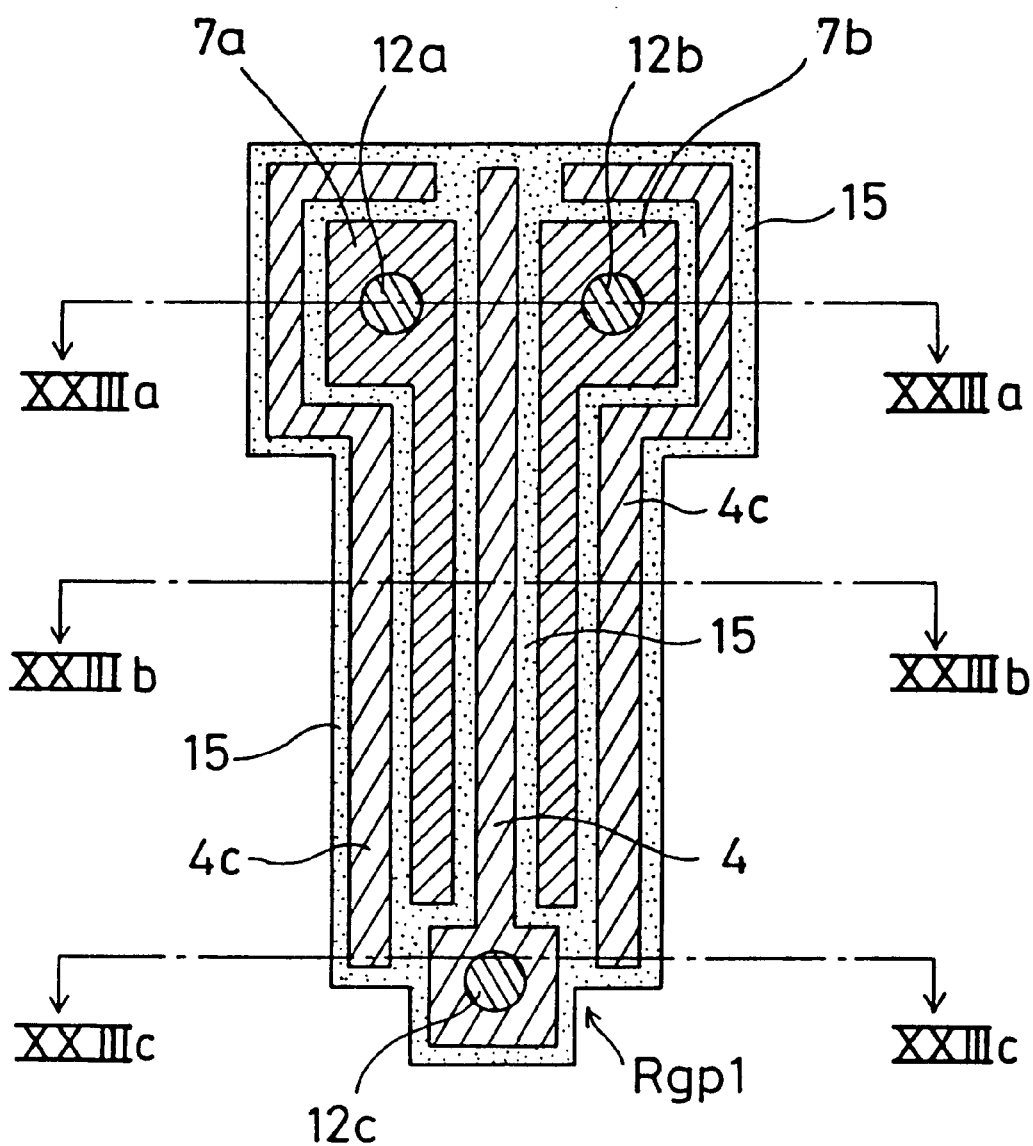
FIG. 22 is a plan view of the wafer after tungsten has been buried in two contact layers in the manufacturing process of the semiconductor apparatus according to the eighth embodiment.
Figure 23A:
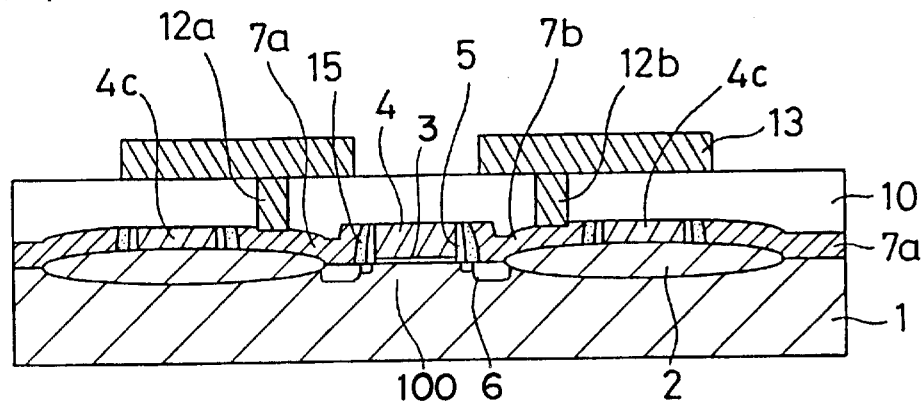
FIGS. 23(a) to 23(c) are respective cross sectional views taken along the lines XXIIIa—XXIIIa, XXIIIb—XXIIIb, and XXIIIc—XXIIIc shown in FIG. 22.
Figure 23B:
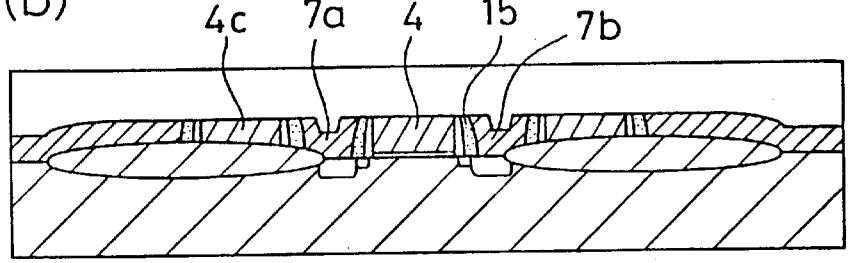
Figure 23C:
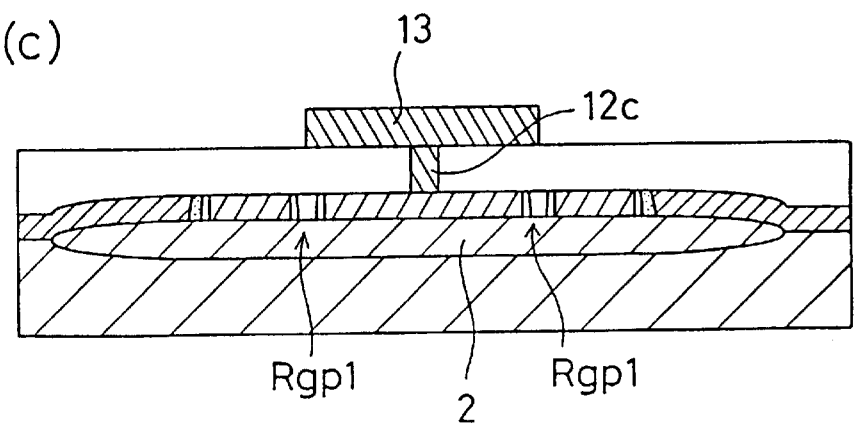

Below, a description will be given to the characteristic portions of the semiconductor apparatus formed in accordance with the present embodiment with reference to FIG. 22 and FIGS. 23(a) to 23(c). FIG. 22 is a plan view of the semiconductor apparatus in the step shown in FIG. 19(e). For the sake of clarity, the drawing of the first-layer metal interconnection 13 has been omitted and, since the low-temperature oxide film 10 is a transparent body, the semiconductor apparatus is shown as viewed therethrough. FIGS. 23(a) to 23(c) are cross sectional views taken along the lines XXIIIa to XIIIa, XXIIIb—XXIIIb, and XXIIIc—XXIIIc, respectively, in which is also shown the first metal interconnection 13.

As shown in FIG. 22, the source electrode 7a and drain electrode 7b are surrounded by the side walls 15 for isolating the gate interconnections 4c from the gate electrode 4. On the source electrode 7a, drain electrode 7b, and gate electrode 4 are formed the contact portions 12a, 12b, and 12c, respectively, each of which occupies a large area of its corresponding electrode. As can be seen from the plan-view structure, each of the gate electrode 4, source electrode 7a, and drain electrode 7c is topographically as well as electrically isolated from each other by the side walls 15 for isolation. Moreover, each of the electrodes 4, 7a, and 7b is also electrically isolated from the gate interconnections 4c on the LOCOS film 2.

As shown in FIG. 23(a), in cross section vertically taken across the contact portions 12a and 12b of the source/drain electrodes 7a and 7b, the contact portions 12a and 12b are provided on the LOCOS film 2, so that they may be effective in protecting the active region 100 and in reducing the area of the high-concentration diffusion layers and hence have the advantage over the salicide process. In FIG. 23(b) are shown the gate electrode 4, source electrode 7a, drain electrode 7b, and gate interconnections 4c that have been isolated from each other by the side walls 15 for isolation. In FIG. 23(c) are shown the gate electrode 4 and the gate interconnections 4c on both sides thereof that have been isolated from each other by the insulating film for forming side walls buried completely in the two first interspaces Rgp1.

The member for isolating individual semiconductor apparatus is not limited to the LOCOS film. In place of the LOCOS film, it is also possible to provide isolations composed of an insulating film buried in trenches.

Although the present embodiment has used the polysilicon film as the first conductive film for composing the gate electrode 4 and gate interconnections 4c, it will be appreciated that the first conductive film may be composed of polycide or polymetal.

(Ninth Embodiment)

Figure 24:
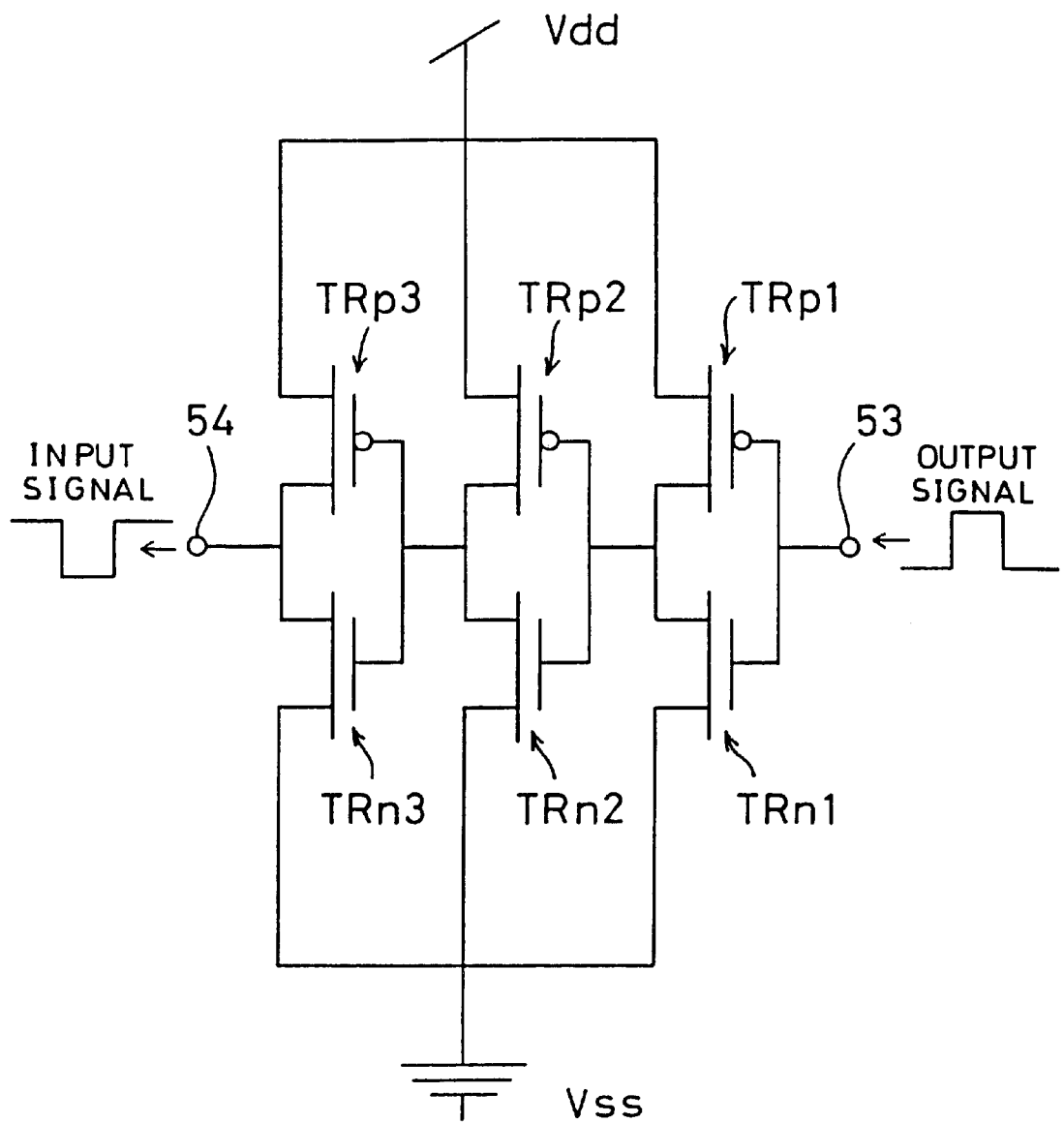
FIG. 24 is an electric circuit diagram of an inverter chain according to a ninth embodiment.

Next, a description will be given to a ninth embodiment with reference to FIGS. 24 to 28. FIG. 24 is a circuit diagram of the semiconductor apparatus according to the present embodiment. FIGS. 25 to 28 are plan views of the semiconductor apparatus in individual steps of the manufacturing process thereof according to the present embodiment.

In the present embodiment, a description will be given to a specific case of forming an inverter chain based on the manufacturing process described in the above eighth embodiment (see FIGS. 19(*a*) to (*e*)).

FIG. 24 is a circuit diagram of the inverter chain composed of CMOS circuits. As shown in the drawing, the inverter chain comprises three p-channel MOS transistors TRp1 to TRp3 and three n-channel MOS transistors TRn1 to TRn3, which form three CMOS inverters composed of the p-channel transistors and n-channel transistors. To the drain of each of the p-channel MOS transistors TRp1 to TRp3 is applied a voltage Vdd from a power-source supply terminal. The source of each of the n-channel MOS transistors TRn1 to TRn3 is connected to a ground terminal for supplying a ground potential Vss. The inverter chain is so constituted as to invert a signal inputted to an input terminal 53 and output the inverted signal from an output terminal 54.

Figure 20:
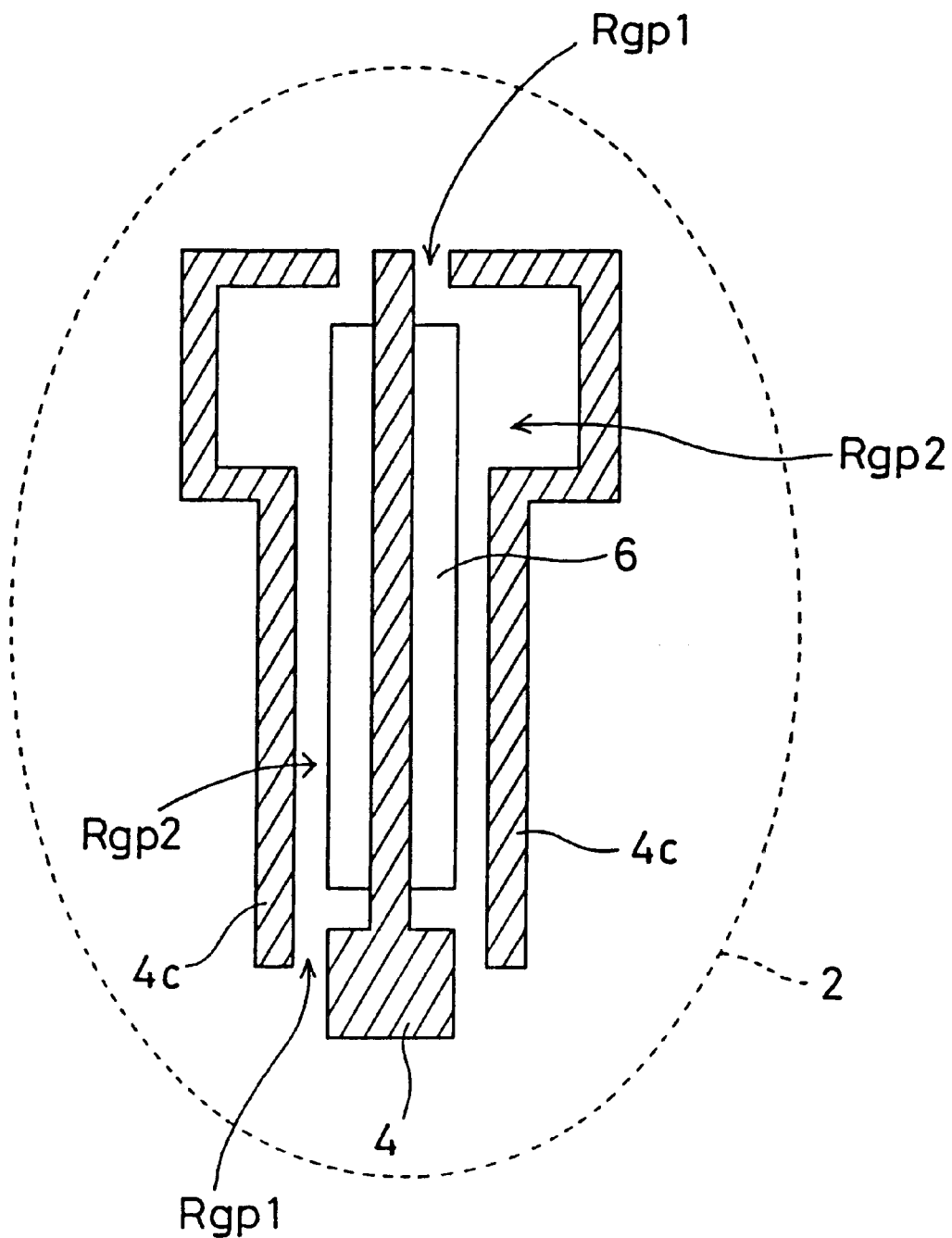
FIG. 20 is a plan view of the wafer after the steps of forming gate interconnections and high-concentration diffusion layers in the manufacturing process of the semiconductor apparatus according to the eighth embodiment.
Figure 25:
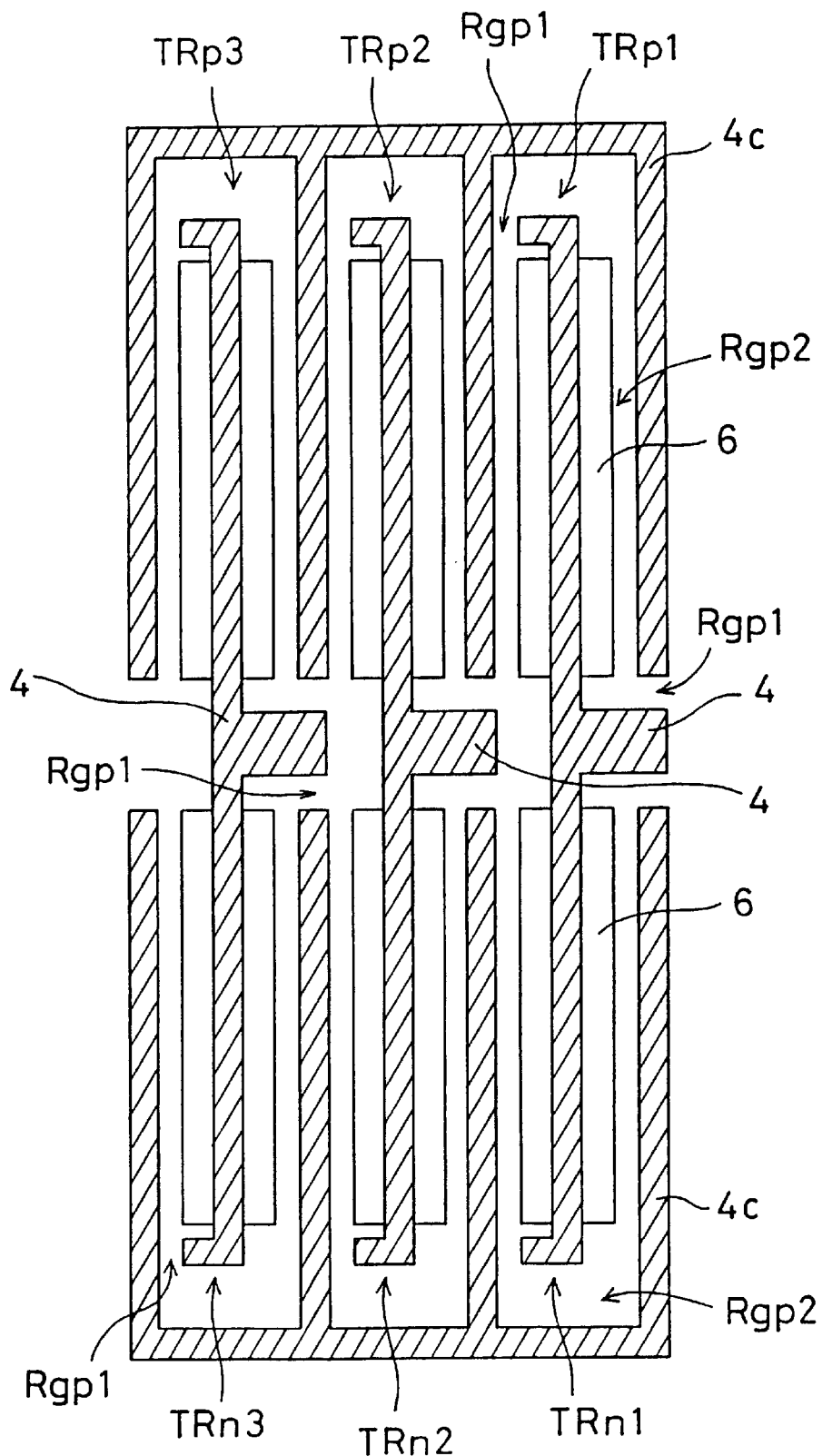
FIG. 25 is a plan view of a wafer after the formation of a gate electrode, gate interconnections, and high-concentration diffusion layers in the manufacturing process of the inverter chain according to the ninth embodiment.

FIG. 25 is a plan view of the inverter chain before it is subjected to a step corresponding to FIG. 20 in the eighth embodiment. Briefly, FIG. 25 shows the inverter chain before the side walls 5 for LDD are formed in the step shown in FIG. 19(*a*). As shown in the drawing, the gate electrodes 4 of the pair of p-channel and n-channel MOS transistors forming the CMOS transistor are composed of a single polysilicon film. The comb-shaped gate interconnection 4c, which surrounds the three gate electrodes 4, is formed on the LOCOS film. The gate interconnection 4c has been divided into two parts, one of which is located on the side of the p-channel MOS transistors TRp1 to TRp3 and the other of which is located on the side of the n-channel MOS transistors TRn1 to TRn3. Between each of the gate electrodes 4 and the gate interconnections 4c are formed the first interspaces Rgp1 each of which is smaller in width than the specified value T and the second interspace Rgp2 which is larger in width than the specified value T. The second interspace Rgp2 is formed in a region including the active region 6 and a part of the LOCOS film, while the first interspaces are provided on the LOCOS film.

Figure 26:
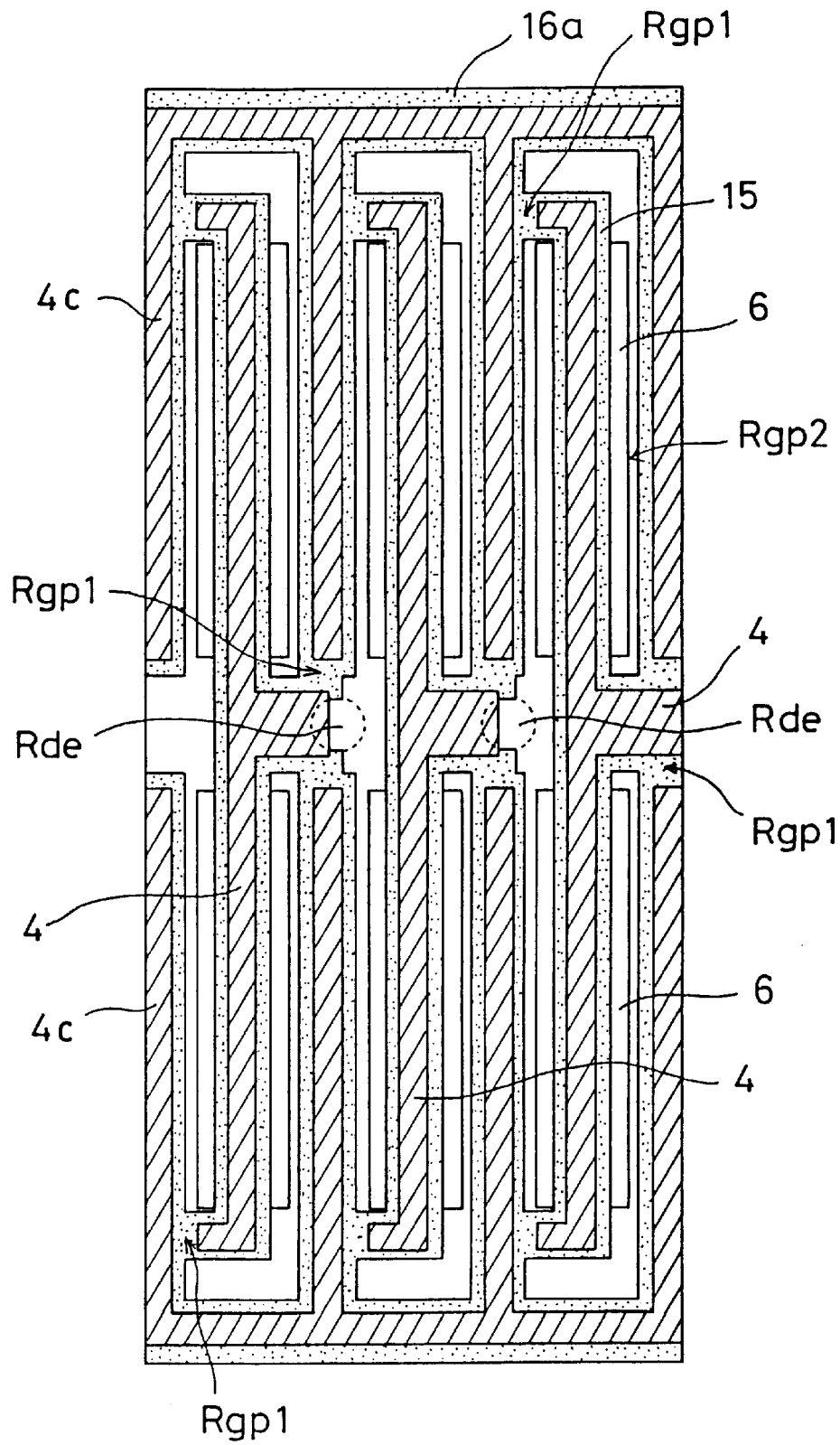
FIG. 26 is a plan view of the wafer after the formation of side walls in the manufacturing process of the inverter chain according to the ninth embodiment.

FIG. 26 is a plan view of the inverter chain after the side walls 15 for isolation have been formed on the side faces of the gate electrodes 4 and gate interconnections 4c. The drawing shows the structure in the same step as that shown in FIG. 21 of the eighth embodiment, except that the present embodiment includes the step of partially removing the side walls 15 for isolation formed by anisotropic etching through the photolithographic process and etching process. Consequently, side-wall removal portions Rde are provided in the central portions of the gate electrodes 4 of the second-stage and third-stage CMOS inverters. As will be described below, the removal portion Rde functions as a point connecting the inverter in the stage of concern to the inverter in the subsequent stage, i.e., a point connecting the source/drain electrodes in the stage of concern to the gate electrode in the subsequent stage.

Figure 27:
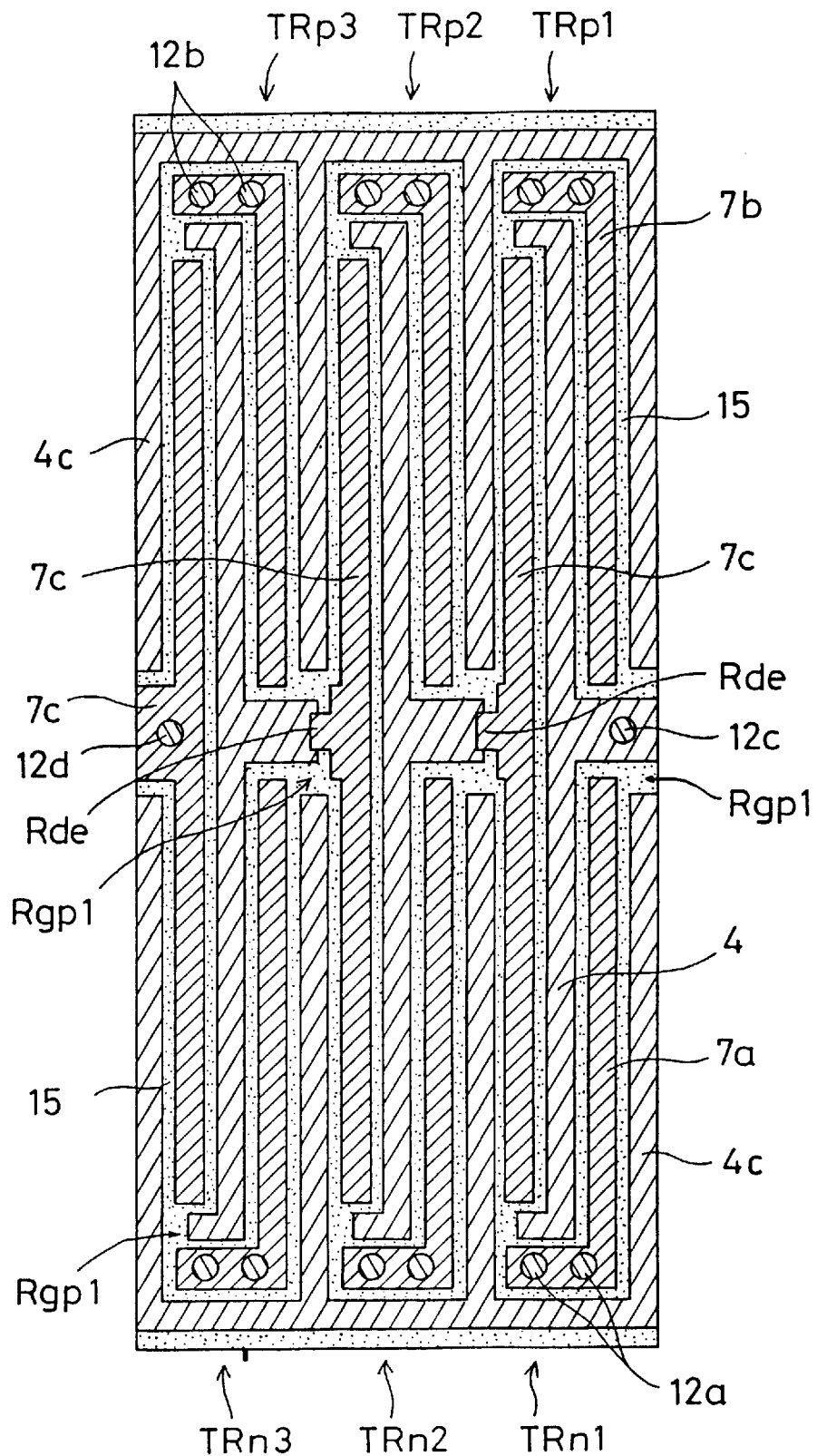
FIG. 27 is a plan view of the wafer after tungsten has been buried in contact holes in the manufacturing process of the inverter chain according to the ninth embodiment.

FIG. 27 is a plan view showing the structure at the stage concurrent with the above step shown in FIG. 22, in which a W/TiN/Ti film is deposited and only the portion thereof positioned on the gate electrode 4 and gate interconnection 4c is selectively polished by CMP for metal, followed by the deposition of a low-temperature oxide film and the formation of the contact holes into which W has been buried. As shown in the drawing, in each of the inverters, the drain electrode 7b of the p-channel MOS transistor, the source electrode 7a of the n-channel MOS transistor, and the common electrode 7c serving as the source electrode of the p-channel MOS transistor and as the drain electrode of the n-channel MOS transistor have been isolated from each other by CMP. The contact portion 12a for connection with the ground terminal is provided in a part of the source electrode 7a. The contact portion 12b for connection to the power-source supply terminal is provided in a part of the drain electrode 7b. The contact portion 12c for connection to the input terminal is provided in the gate electrode 4 of the first-stage inverter. The contact portion 12d for connection to the output terminal is provided in the common electrode 7c of the third-stage inverter.

Figure 28:
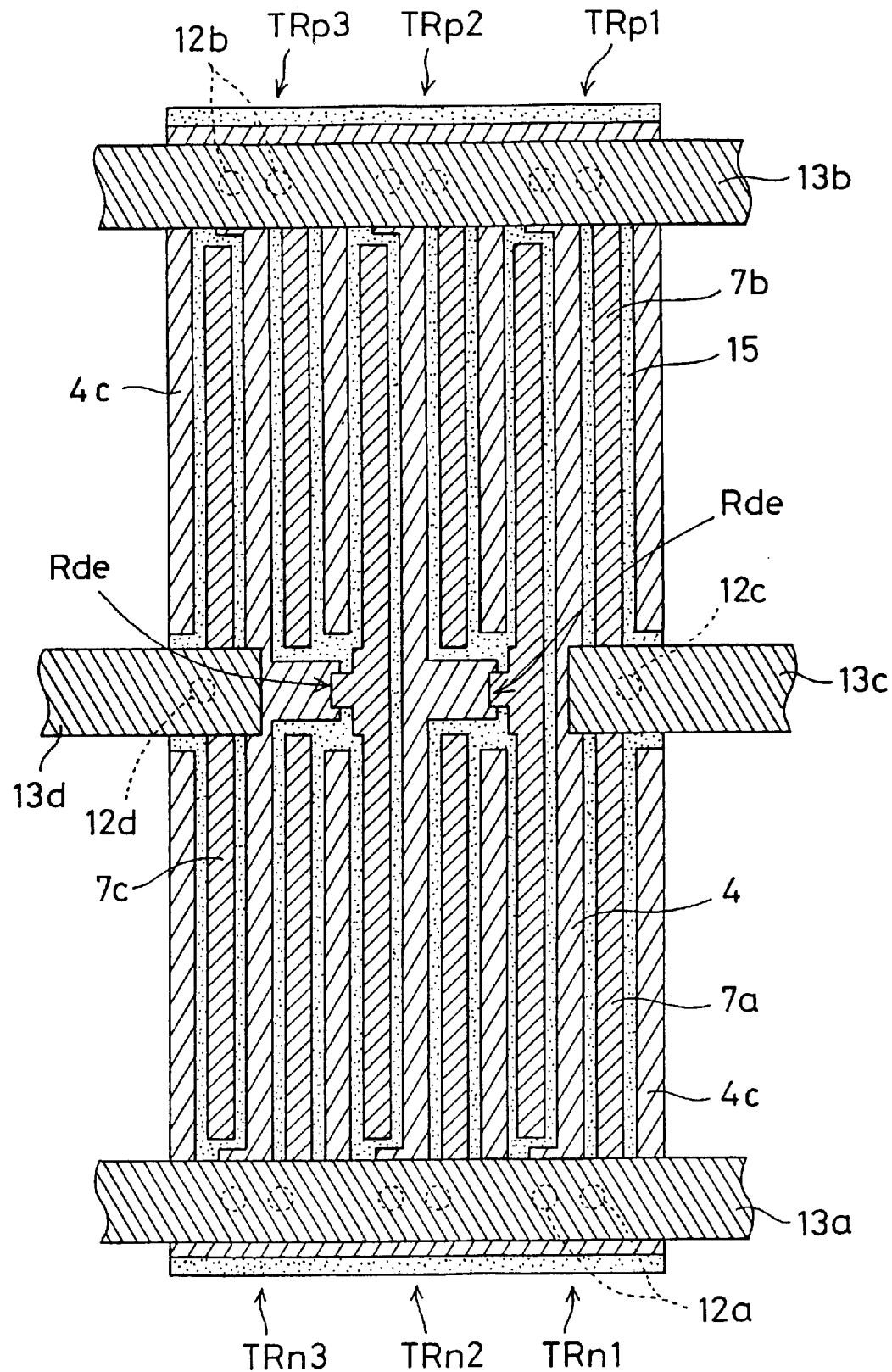
FIG. 28 is a plan view of the wafer after the formation of a first-layer metal interconnection in the manufacturing process of the inverter chain according to the ninth embodiment.

FIG. 28 is a plan view of the inverter chain in the state in which, after the deposition of the metal film, the first-layer metal interconnection 13 has been formed by performing the photolithographic process and etching process. As shown in the drawing, there are provided: the first-layer metal interconnection 13a to be connected to the source electrode 7a of each of the inverters via the contact portion 12a and to the ground terminal: the first-layer metal interconnection 13b to be connected to the drain electrode 7b of each of the inverters via the contact portion 12b and to the power-source supply terminal; a first-layer metal interconnection 13c to be connected to the gate electrode 4 of the first-stage inverter via the contact portion 12c and to the input terminal; and a first-layer metal interconnection 13d to be connected to the common electrode 7c of the third-stage inverter via the contact portion 12d and to the output terminal.

With the structure of the inverter chain according to the present embodiment, it becomes possible to connect all the regions except power-source lines (first-layer metal interconnections 13a to 13d) by means of the polysilicon film and W/TiN/Ti film, so that the circuit area can advantageously be reduced to a great extent.

(Tenth Embodiment)

Next, a description will be given to a tenth embodiment with reference to FIGS. 29(*a*) to 29(*e*). The drawings illustrate the process of manufacturing the semiconductor apparatus embodying a modified form of the process according to the above eighth embodiment.

First, as shown in FIG. 29(*a*), the LOCOS film 2 with a thickness of about 300 nm is formed in a thermal oxidation furnace so as to isolate the individual transistors to be formed on the silicon substrate 1. After conducting the ion implantation and thermal treatment suitable for forming the p-channel MOSFET and n-channel MOSFET, the gate oxide film 3 with a thickness of about 10 nm is formed by dry oxidation and then the polysilicon film is formed by LP-CVD, followed by further deposition of the PSG film on the polysilicon film. Subsequently, the photolithographic process and dry etching process are performed so as to form the gate electrode 4 and an overlying spacer film 17a from the resulting two-layer film over the active region and to form the gate interconnections 4c and an overlying spacer film 17b from the resulting two-layer film on the LOCOS film 2. After completing the ion implantation suitable for forming the transistor of LDD structure, the HTO film is deposited by LP-CVD over the entire surface and then subjected to highly anisotropic dry etching, thereby forming the side walls 5 for LDD from an oxide film on both sides of the gate electrode 4. Thereafter, ion implantation for forming diffusion layers (high-concentration source/drain) is conducted with a high dose, followed by activation at an appropriate temperature. Thus far, the process is the same as that of the above eighth embodiment, except that the PSG film (spacer film) is deposited on the polysilicon film.

Figure 29A:
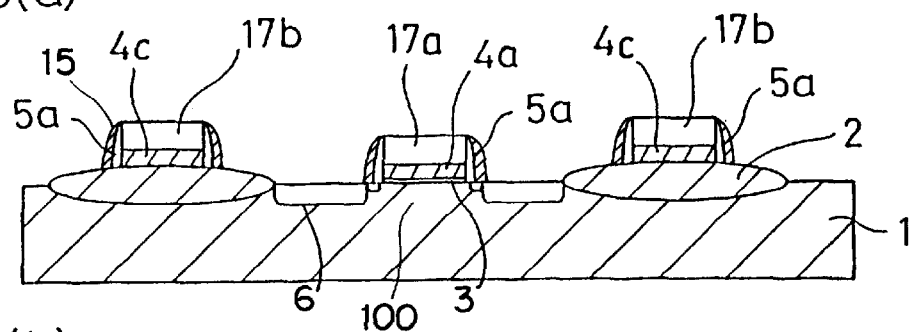
FIGS. 29(a) to 29(e) are cross sectional views of a wafer illustrating the manufacturing process of the semiconductor apparatus according to a tenth embodiment.
Figure 29B:
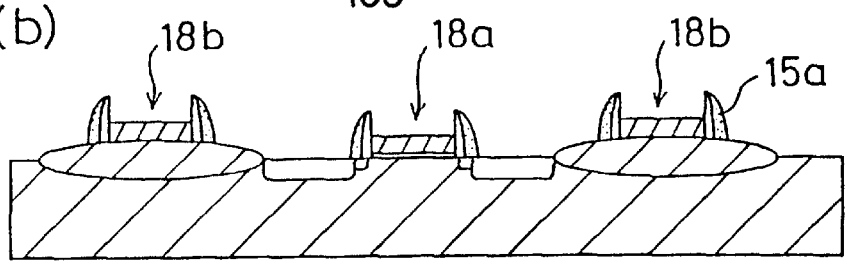

Next, as shown in FIG. 29(b), the deposition of a silicon nitride film and anisotropic dry etching are conducted, thereby forming the side walls 15 for isolation on the side walls 5 for LDD. The process is the same as that described above in the eighth embodiment. At this stage, the present embodiment selectively removes the overlying spacer films 17a and 17b by vapor-phase etching using HF vapors, thereby forming concave portions 18a and 18b over the gate electrode 4 and gate interconnections 4c, respectively. Of the interfaces located between the gate electrode 4 and the gate interconnections 4c, the first interfaces Rgp1 have been buried completely with the HTO film for forming sidewalls as shown in FIG. 21 for the eighth embodiment, though the drawing thereof is omitted in the present embodiment. In the present embodiment, however, the respective concave portions 18a and 18b over the gate electrode 4 and gate interconnections 4c also form the second interspaces Rgp2, each of which is larger in width than the specified value T. As for the second interspaces Rgp2 formed in the same areas as in FIG. 21, they are isolated from the exterior of the gate interconnections 4c with the first interspaces Rgp1 buried with the HTO film.

Figure 29C:
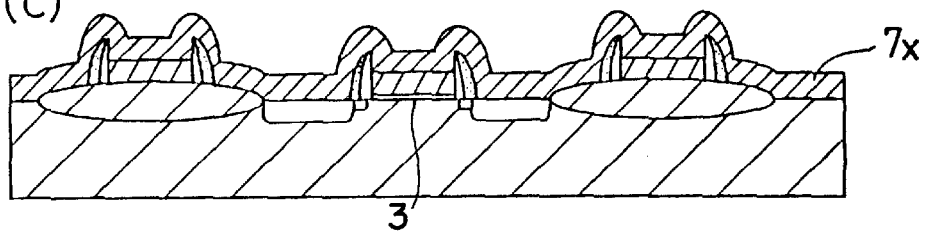

Next, as shown in FIG. 29(c). sputtering is performed after a dip etching process using an etchant containing HF as its main component, so as to sequentially deposit a Ti film with a thickness of 10 nm and a TiN film with a thickness of 30 nm. After that, further sputtering is performed so as to deposit a W film with a thickness of 100 nm, thereby forming the multi-layer metal film 7x composed of W/TiN/Ti.

Figure 29D:
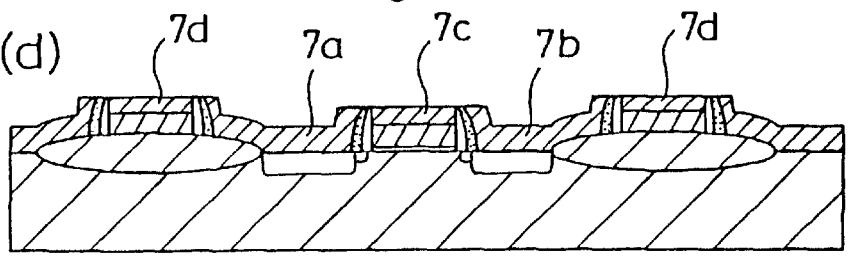

Next, as shown in FIG. 29(d), the multi-layer metal film 7x is removed using CMP for metal till both of the gate electrode 4 and gate interconnections 4c become exposed, thereby isolating the multi-layer metal films 7x in the two respective second interspaces Rgp2 shown in FIG. 21. The respective multi-layer metal films 7x function as the source electrode 7a, drain electrode 7b, upper gate electrode 7c, and upper gate interconnections 7d. Specifically, the gate electrode 4, upper gate electrode 7c, gate interconnections 4c, and upper gate interconnections 7d function as the first conductive interconnections, while the source electrode 7a, drain electrode 7b, upper electrode 7c, and upper gate interconnections 7d function as the second conductive interconnections.

Figure 29E:
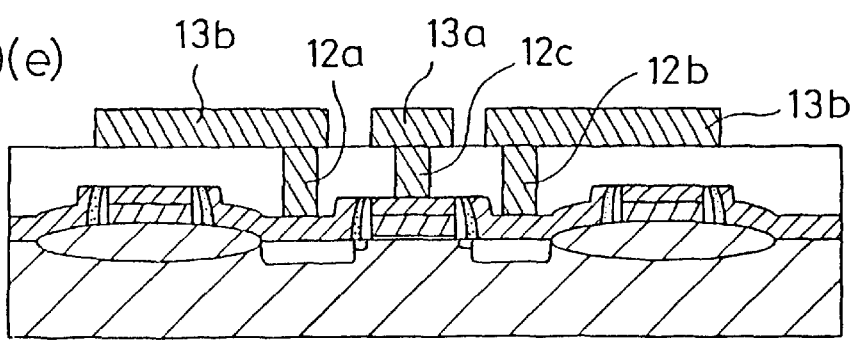

Next, as shown in FIG. 29(e), the low-temperature oxide film 10 (USG film formed by CVD under ordinary pressure) is deposited to a thickness of about 500 nm. followed by the formation of the contact holes therein. Subsequently, W (tungsten) is buried in the contact holes by selective CVD, thereby forming the contact portions 12a, 12b, 12c, and 12d (of which the contact portion 12d is not shown) of the source electrode 7a, drain electrode 7b, upper electrode 7c, and upper gate interconnections 7d. Finally, after forming the Tin/AlSiCu/Ti film, the photolithographic process and dry etching process are conducted so as to form the first-layer metal interconnections 13a to 13d (of which the first-layer metal interconnection is not shown) by patterning the TiN/AlSiCu/Ti film.

In the present embodiment, since the upper gate electrode 7a and upper gate interconnection 7b, each composed of the W/TiN/Ti film and originally functioning as the second conductive interconnection, are in direct contact with the top surfaces of the gate electrode 4 and gate interconnections 4c, the resistances of the gate electrode 4 and gate interconnection 7b can be reduced advantageously. In this case, the number of steps for metal formation can be reduced by one compared with the method of composing the gate electrode and gate interconnections of polycide or polymetal, resulting in reduced cost.

Although the silicon substrate has been used as a semiconductor substrate in the description of the above embodiments, the present invention is not limited thereto. The present invention is also applicable to a compound semiconductor substrate such as GaAs.

Although the isolation is composed of the LOCOS film in the above embodiments, the present invention is not limited thereto. The present invention is also applicable to an isolation of trench structure or the like.

We claim:

1. A semiconductor device in which a plurality of MISFETs are disposed on a semiconductor substrate, comprising:

an isolation for dividing a region in the vicinity of a surface of said semiconductor substrate into a plurality of active regions;

gate insulating films and gate electrodes of said MISFETs formed in said plurality of active regions;

at least two gate interconnections formed on said isolation and separated by at least two first interspaces, each of which is smaller in width than a specified value T, and a second interspace, which is larger in width than the specified value T, interposed therebetween, said first interspaces being located between said gate electrodes and said gate interconnections, said second interspace being located between said first interspaces;

an insulating film for isolation composed of an insulating material, which buries said first interspaces and forms side walls on both side faces of said gate electrodes and said gate interconnections in said second interspace;

impurity diffusion layers formed in those regions of the active regions which are located on both sides of said gate electrodes and functioning as source/drain regions of said MISFETs; and two metal films functioning as the source/drain electrodes of each of said MISFETs, which are formed on the semiconductor substrate in said active regions by self alignment with respect to the insulating film for isolation, the top surfaces of said two metal films being planarized together with the top surfaces of said gate electrodes, said gate interconnections, and said insulating film for isolation so as to be isolated from other regions.

2. A semiconductor device according to claim 1, further comprising:

second side walls for LDD formed on the both side faces of the gate electrodes of each of said MISFETs, wherein said second side walls are deposited on said side walls.

3. A semiconductor device in which a plurality of MISFETs are disposed on a semiconductor substrate, comprising:

an isolation for partitioning a region of said semiconductor substrate into a plurality of active regions;

a gate electrode formed in each of said active regions;

a stepped gate insulating film interposed between said gate electrode and said semiconductor substrate and consisting of a portion sufficiently thin to enable the function of each of said MISFETs and a portion sufficiently thick to disenable the function of each of the MISFETs;

side walls made of an insulating material and formed on both sidles of said gate electrode;

impurity diffusion layers formed on both sides of said gate electrode in each of the active regions; and two metal films formed on the semiconductor substrate in each of said active regions by self alignment with respect to each of the side walls of said gate electrode and to the isolation, the top surfaces of said two metal films being planarized together with the top surfaces of the gate electrode, said side walls, and isolation to be isolated from other regions.

4. A semiconductor device in which a plurality of MISFETs are disposed on a semiconductor substrate, comprising:

an isolation for partitioning a region of said semiconductor substrate into a plurality of active regions;

a gate insulating film and a gate electrode formed on said semiconductor substrate in each of said active regions;

regions formed immediately below said gate electrode by introducing an impurity at a concentration corresponding to a threshold which enables the function of each of said MISFETs and by introducing an impurity at a concentration corresponding to a threshold which disenables the function of each of the MISFETs;

side walls made of an insulating material and formed on both sides of said gate electrode;

impurity diffusion layers formed on both sides of said gate electrode in each of the active regions; and two metal films formed on the semiconductor substrate in each of said active regions by self alignment with respect to each of the side walls of said gate electrode and to the isolation, the top surfaces of said two metal films being isolated from other regions.

* * * * *

UNITED STATES PATENT AND TRADEMARK OFFICE
CERTIFICATE OF CORRECTION

PATENT NO. : 5,986,313
DATED : November 16, 1999
INVENTORS : Ueda et al.

It is certified that error appears in the above-identified patent and that said Letter Patent is hereby corrected as shown below:

On the Cover Page:

In the Abstract section, line 17, change "ccntact" to --contact--.

In the Claims:

Claim 3, line 14, change "sidles" to --sides--.

Signed and Sealed this

Third Day of April, 2001

*Attest:*

NICHOLAS P. GODICI

*Attesting Officer*    *Acting Director of the United States Patent and Trademark Office*